US012259112B2

(12) United States Patent
Ho et al.

(10) Patent No.: US 12,259,112 B2
(45) Date of Patent: Mar. 25, 2025

(54) ILLUMINATING CIRCUIT STRUCTURE

(71) Applicant: DARFON ELECTRONICS CORP., Taoyuan (TW)

(72) Inventors: Hsin-Cheng Ho, Taoyuan (TW); Heng-Yi Huang, Taoyuan (TW); Yi-Tung Lo, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 480 days.

(21) Appl. No.: 17/897,211

(22) Filed: Aug. 28, 2022

(65) Prior Publication Data
US 2022/0412541 A1 Dec. 29, 2022

Related U.S. Application Data

(63) Continuation-in-part of application No. 17/538,616, filed on Nov. 30, 2021, now abandoned.

(30) Foreign Application Priority Data

Jun. 22, 2021 (TW) .................................. 110122719
Apr. 1, 2022 (TW) .................................. 111112793

(51) Int. Cl.
*G06F 1/16* (2006.01)
*F21V 19/00* (2006.01)
(Continued)

(52) U.S. Cl.
CPC ........ *F21V 19/0025* (2013.01); *G06F 1/1662* (2013.01); *H05K 1/113* (2013.01);
(Continued)

(58) Field of Classification Search
CPC .............................. G06F 1/1662; G06F 1/1671
(Continued)

(56) References Cited

U.S. PATENT DOCUMENTS 4,449,024 A * 5/1984 Stracener ............. H01H 13/702
362/23.15
6,217,183 B1 * 4/2001 Shipman ................ H01H 13/83
362/23.18
(Continued)

FOREIGN PATENT DOCUMENTS

| CN | 101577260 A | 11/2009 |
| CN | 201440242 U | 4/2010 |

(Continued)

*Primary Examiner* — Adrian S Wilson
(74) *Attorney, Agent, or Firm* — Winston Hsu

(57) ABSTRACT

An illuminating circuit structure includes a film sheet, an illuminant, a printed baseline layer, and a printed pad layer. The printed baseline layer includes a first baseline segment and a second baseline segment printed on the film sheet, while the printed pad layer includes a first bar pad and a second bar pad. For a first baseline head of the first baseline layer and a first pad head of the first bar pad, one of which extends along a first direction and the other of which extends along a second direction not parallel to the first direction. Therefore, the first baseline segment and the first bar pad achieve electrical connection despite of an existed print shifting. Similarly, a second baseline head of the second baseline layer and a second pad head of the second bar pad also can achieve electrical connection despite of an existed print shifting.

20 Claims, 16 Drawing Sheets

(51) Int. Cl.
  *H05K 1/11* (2006.01)
  *F21Y 115/10* (2016.01)
  *G06F 3/02* (2006.01)
(52) U.S. Cl.
  CPC ......... *F21Y 2115/10* (2016.08); *G06F 3/0202* (2013.01); *H05K 2201/09281* (2013.01); *H05K 2201/09381* (2013.01); *H05K 2201/10106* (2013.01)
(58) Field of Classification Search
  USPC .................................................... 361/679.08
  See application file for complete search history.

(56) References Cited

U.S. PATENT DOCUMENTS

| | | | | |
|---|---|---|---|---|
| 6,860,612 | B2* | 3/2005 | Chiang | G02B 6/0068 362/23.05 |
| 7,955,090 | B2 | 6/2011 | Watanabe | |
| 8,383,971 | B2 | 2/2013 | Liu | |
| 8,742,432 | B2 | 6/2014 | Sato | |
| 9,329,433 | B2* | 5/2016 | Negishi | H10H 20/831 |
| 9,805,955 | B1 | 10/2017 | Sininorakul | |
| 2010/0038226 | A1 | 2/2010 | Lin | |
| 2010/0182529 | A1 | 7/2010 | Nakanishi | |
| 2011/0042124 | A1 | 2/2011 | Matsui | |
| 2011/0186340 | A1 | 8/2011 | Kuramoto | |
| 2011/0309379 | A1 | 12/2011 | Shibusawa | |
| 2012/0193772 | A1 | 8/2012 | Jiang | |
| 2014/0168935 | A1 | 6/2014 | Chen | |
| 2014/0217429 | A1 | 8/2014 | Lin | |
| 2016/0042891 | A1 | 2/2016 | Ligtenberg | |
| 2016/0284493 | A1 | 9/2016 | Chen | |
| 2017/0309549 | A1 | 10/2017 | Wachtler | |
| 2017/0328524 | A1 | 11/2017 | Peterson | |
| 2018/0106956 | A1 | 4/2018 | Wang | |
| 2018/0321542 | A1 | 11/2018 | Onishi | |
| 2019/0326267 | A1 | 10/2019 | Han | |
| 2019/0371537 | A1 | 12/2019 | Huang | |
| 2019/0371538 | A1 | 12/2019 | Huang | |
| 2020/0013766 | A1 | 1/2020 | Kim | |
| 2020/0083147 | A1* | 3/2020 | Bito | H01L 23/49816 |

FOREIGN PATENT DOCUMENTS

| | | |
|---|---|---|
| CN | 102625578 A | 8/2012 |
| CN | 105470378 A | 4/2016 |
| CN | 110880456 A | 3/2020 |
| JP | 4926789 B2 | 5/2012 |
| TW | 201146096 A1 | 12/2011 |
| TW | M478318 U | 5/2014 |
| TW | M546017 U | 7/2017 |
| TW | 201923728 A | 6/2019 |
| TW | 202004810 A | 1/2020 |

\* cited by examiner

ILLUMINATING CIRCUIT STRUCTURE

CROSS REFERENCE TO RELATED APPLICATIONS

This application is a continuation-in-part of U.S. application Ser. No. 17/538,616, filed on Nov. 30, 2021, which is incorporated herein by reference.

BACKGROUND OF THE INVENTION

1. Field of the Invention

The present invention relates to a circuit structure for an illuminant, and more particularly to an illuminating circuit structure that utilizes an overlapping design of a printed baseline layer and a printed pad layer to tolerate print shifting.

2. Description of the Prior Art

Recently, the need for disposing illuminants on a circuit board is increasing, for example, disposing an illuminant on a circuit board of a keyboard. A pressing on a corresponding key will turn on the illuminant to emit light.

In the art, a printed circuit board is usually prepared by forming metallic traces on an insulation substrate by etching processes. Thus, if an illuminant is required to be disposed on a printed circuit board, electrode leads of the illuminant are usually connected to corresponding metallic traces on the printed circuit board through soldering with solder paste. However, the soldering process usually needs a high temperature furnace, resulting in a high manufacturing cost.

In order to reduce the high cost due to using the high temperature furnace for the soldering with solder paste, the prior art has also been modified to use a conductive adhesive to attach the illuminant to the metallic traces. Please refer to FIG. 1, which is a schematic diagram illustrating a layout of an illuminating circuit structure in the prior art with an illuminant attached thereon with conductive adhesives. As shown by FIG. 1, an illuminating circuit structure PA100 includes a printed baseline layer PA1 and a conductive adhesive layer PA2. The printed baseline layer PA1 and a conductive adhesive layer PA2. The conductive adhesive layer PA2 includes a first conductive adhesive PA21 and a second conductive adhesive PA22.

The first conductive adhesive PA21 is to connect the first printed circuit trace PA11, while the second conductive adhesive PA22 is connected with the second printed circuit trace PA12. Thereby, users can dispose an illuminant PA200 so that a first electrode PA201 and a second electrode PA202 of the illuminant PA200 are connected to the first adhesive PA21 and the second adhesive PA22 respectively and so the printed baseline layer PA1 can electrically connect with the illuminant PA200 through the conductive adhesive layer PA2.

Please refer to FIG. 2, which is a schematic diagram illustrating that the conductive adhesives in the prior art are deviated from the corresponding printed baseline layer due to possible errors in printing and coating processes. As shown by FIG. 1, although the conductive adhesive layer PA2 can be applied to connect electrically the illuminant PA200 to the printed baseline layer PA1, the conductive adhesive layer PA2 are formed on the printed baseline layer PA1 through screen printing so practically the conductive adhesive layer PA2 would be easily deviated from expected positions for connecting with the printed baseline layer PA1 due to errors in printing and coating. Even though the illuminant PA200 can be accurately connected to the conductive adhesive layer PA2, the illuminant PA200 still may fail to be electrically connected to the printed baseline layer PA1 through the conductive adhesive layer PA2 due to the printing errors of the conductive adhesive layer PA2.

SUMMARY OF THE INVENTION

An embodiment according to the invention provides an illuminating circuit structure includes a first baseline segment, a second baseline segment, a first pad, a second pad, a film sheet, and an illuminant. The first baseline segment extends in a baseline direction and includes a first baseline head extending in an electrode connection direction. The first baseline head has a first length in the electrode connection direction and a fifth length in the baseline direction. The first length is substantially greater than the fifth length. The baseline direction and the electrode connection direction form a tolerance included angle, such that the first baseline head of the first baseline segment forms a branch structure. The second baseline segment includes a second baseline head extending in the electrode connection direction. The first pad includes a first rear end and a first front end connecting with each other. The first rear end extends in the baseline direction and is connected to the first baseline head. The second pad includes a second rear end and a second front end connecting with each other. The second rear end extends in the baseline direction and is connected to the second baseline head. The first baseline segment, the second baseline segment, the first pad, and the second pad are disposed on the film sheet. The illuminant has a pair of electrodes. The electrodes define the electrode connection direction and are electrically connected to the first front end and the second front end respectively. The first front end and the second front end except for the branch structure are located in an orthographic projection of the illuminant or around the orthographic projection.

In an embodiment, the first baseline segment includes a first baseline lead extending in the baseline direction. The first baseline head is integrally connected to the first baseline lead to form the branch structure.

In an embodiment, the first pad as a whole has a sixth length in the baseline direction. The sixth length is greater than the fifth length of the first baseline head.

In an embodiment, the second baseline segment has a second baseline lead extending in the baseline direction to form another branch structure.

In an embodiment, the second baseline head has a second length in the electrode connection direction and a seventh length in the baseline direction. The second length is substantially greater than the seventh length.

According to another embodiment, an illuminating circuit structure includes a first baseline segment, a second baseline segment, a first pad, a second pad, a film sheet, and an illuminant. The first baseline segment includes a first baseline head extending in a baseline direction. The first baseline head has first length in an electrode connection direction. The second baseline segment includes a second baseline head extending in the baseline direction. The first pad includes a first rear end and a first front end connecting with each other. The first rear end extends in the electrode connection direction and has a third length in the electrode connection direction greater than the first length. The first rear end is connected to the first baseline head. The baseline direction and the electrode connection direction form a tolerance included angle, such that the first rear end of the first pad forms a branch structure. The second pad includes a second rear end and a second front end connecting with each other. The second rear end extends in the electrode connection direction and is connected to the second baseline head. The first baseline segment, the second baseline segment, the first pad, and the second pad are disposed on the film sheet. The illuminant has a pair of electrodes. The electrodes define the electrode connection direction and are electrically connected to the first front end and the second front end respectively. The first front end and the second front end except for the branch structures are located in an orthographic projection of the illuminant or around the orthographic projection.

In an embodiment, the first pad includes a first front end extending in the baseline direction. The first rear end is integrally connected to the first front end to form the branch structure.

In an embodiment, the first pad and the second pad have a same shape but are arranged asymmetrically to each other.

In an embodiment, the first front end is integrally connected to a middle or end portion of the first rear end.

In an embodiment, the first baseline head and the first rear end form a cross shape.

In an embodiment, the illuminant, the first front end, and the second front end are between the first baseline segment and the second baseline segment.

In an embodiment, a sum of lengths of the illuminant, the first pad, and the second pad in the electrode connection direction is greater than a distance between the first baseline segment and the second baseline segment.

In an embodiment, the first front end and the second front end are respectively vertical to the electrode connection direction.

In an embodiment, the first baseline segment includes a first baseline lead extending in the baseline direction. The second baseline segment includes a second baseline lead extending in the baseline direction. The first baseline lead and the second baseline lead are spaced in the baseline direction and/or the electrode connection direction.

According to another embodiment, an illuminating circuit structure includes at least one first baseline segment, at least one second baseline segment, at least one first pad, at least one second pad, a film sheet, and at least one illuminant. The first baseline segment extends in an electrode connection direction and includes a first baseline head. The second baseline segment extends in the electrode connection direction and includes a second baseline head. The first pad includes a first rear end and a first front end connecting with each other. The first rear end extends in a bridging direction and is connected to the first baseline head. The bridging direction and the electrode connection direction form a tolerance included angle, such that a branch structure is formed where the first baseline head and the first rear end are connected. The second pad extends in the bridging direction and is connected to the second baseline head. The first baseline segment, the second baseline segment, the first pad, and the second pad are disposed on the film sheet. The illuminant has a pair of electrodes. The electrodes define the electrode connection direction and are electrically connected to the first pad and the second pad respectively. Therein, the branch structure is not located in an orthographic projection of the illuminant or around the orthographic projection, and the branch structure has the tolerance included angle.

In an embodiment, the first baseline head of the first baseline segment extends in the bridging direction, and the first rear end extends in the electrode connection direction, forming the branch structure.

In an embodiment, the first baseline head has a first length in the bridging direction and a fifth length in the electrode connection direction. The first length is substantially greater than the fifth length.

In an embodiment, two of the at least one first baseline head extend in the bridging direction. Two of the at least one first rear end extend in the electrode connection direction. The two first baseline heads and the two first rear ends respectively form a branch structure.

In an embodiment, a sum of lengths of the first pad and the second pad in the bridging direction is greater than a distance between the first baseline segment and the second baseline segment.

In an embodiment, the illuminant is located in a keycap projection or a gap surrounding the keycap projection on the film sheet.

In an embodiment, the illuminant is located in a light entrance projection or a gap surrounding the light entrance projection.

In an embodiment, projections of the first baseline head and the second baseline head in the electrode connection direction overlap.

According to another embodiment, an illuminating circuit structure includes N first baseline segments, N second baseline segments, N first pads, N second pads, a film sheet, and N illuminats; therein, N is a positive integer greater than 2. The N first baseline segments are parallel to each other and extend in an electrode connection direction. Each first baseline segment includes a first baseline head. The N second baseline segments are parallel to each other and extend in the electrode connection direction. Each first baseline segment includes a second baseline head. Each first pad includes a first rear end and a first front end connecting with each other. The first rear end is connected to corresponding one of the first baseline heads. At least two of the first front ends extend in a bridging direction and have the tolerance included angle. Each second pad includes a second rear end and a second front end connecting with each other. The second rear end is connected to corresponding one of the second baseline heads. The first baseline segments, the second baseline segments, the first pads, and the second pads are disposed on the film sheet. The N illuminats are disposed in parallel and provide different color lights respectively. Each illuminant has a pair of electrodes defining the electrode connection direction. The electrodes of each illuminant are electrically connected to corresponding one of the first front ends and corresponding one of the second front ends. Therein, the branch structure is not located in an orthographic projection of the illuminant or around the orthographic projection.

As described above, the invention utilizes a printed baseline layer and a printed pad layer to form a branch structure where the printed baseline layer and the printed pad layer overlap, so that even if print shifting occurs on the printed pad layer in the manufacturing of the illuminating circuit structure, the rear end of the first/second pad of the printed pad layer still can overlap the first/second baseline head of the printed baseline layer. Furthermore, the branch structure is not located in the orthographic projection of the illuminant or around the orthographic projection, and the circuit density in the orthographic projection of the illuminant and around the illuminant is reduced, thereby improving the process yield of the illuminating circuit structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
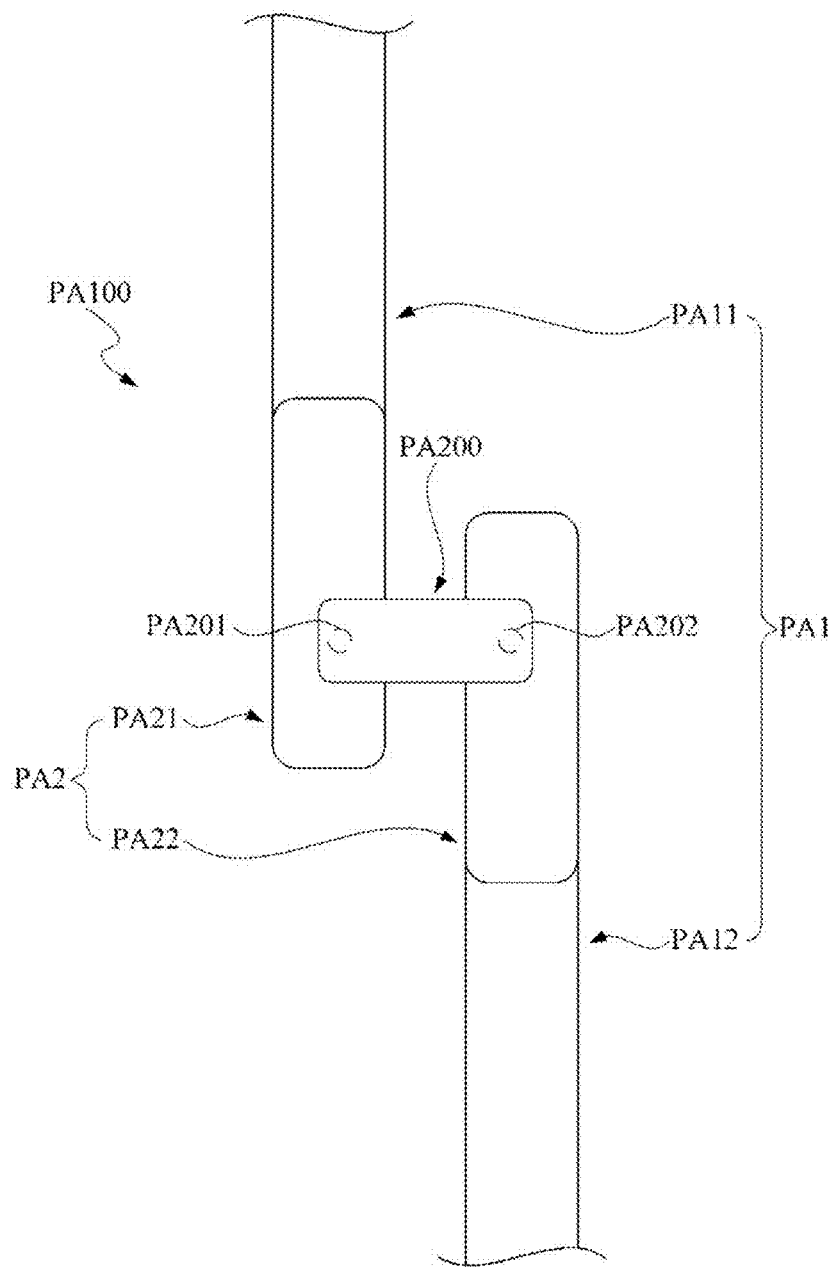
FIG. 1 is a schematic diagram illustrating a layout of an illuminating circuit structure in the prior art with an illuminant attached thereon with conductive adhesives.
Figure 2:
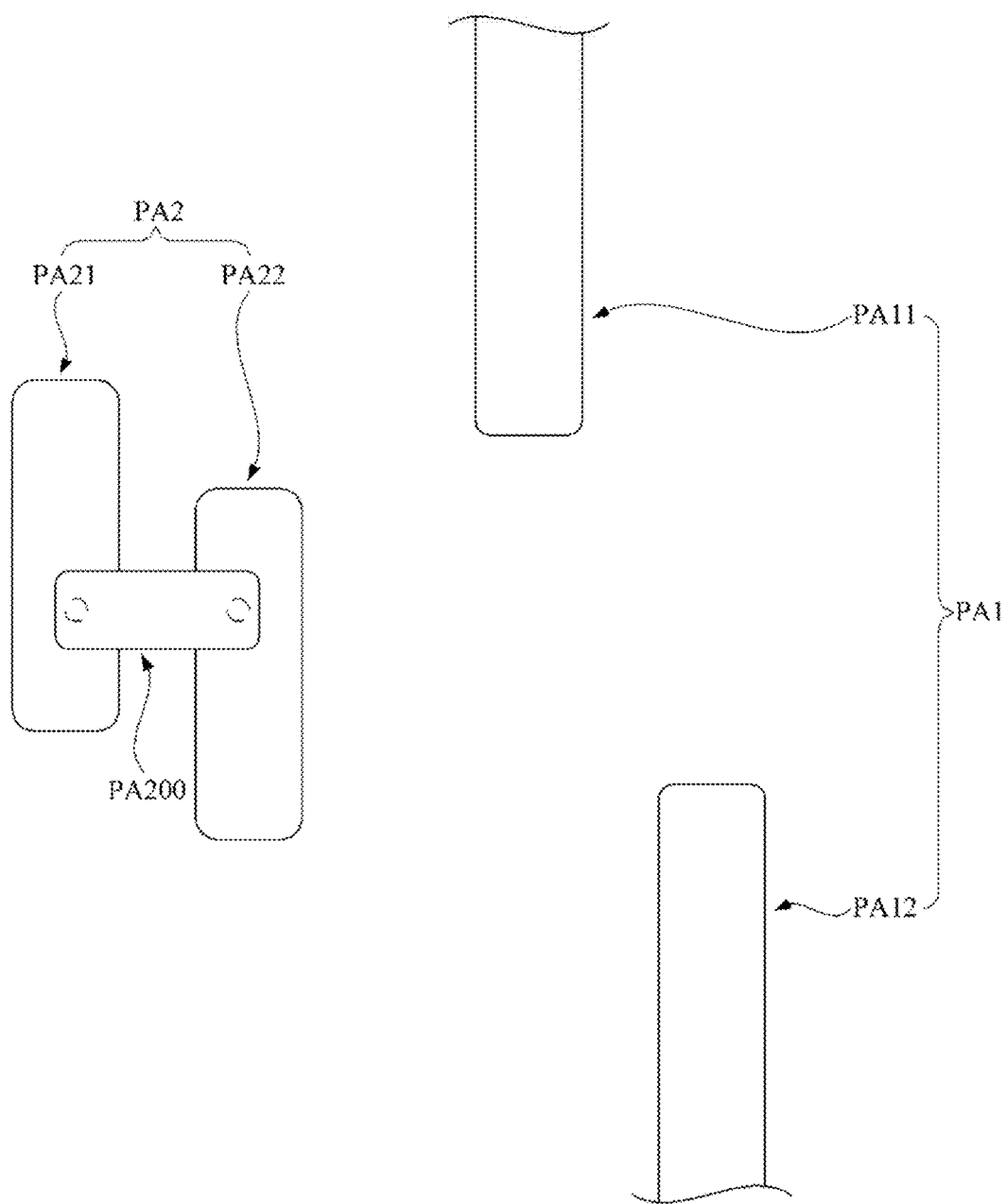
FIG. 2 is a schematic diagram illustrating that the conductive adhesives in the prior art are deviated from a corresponding printed baseline layer due to possible errors in printing and coating processes.
Figure 3:
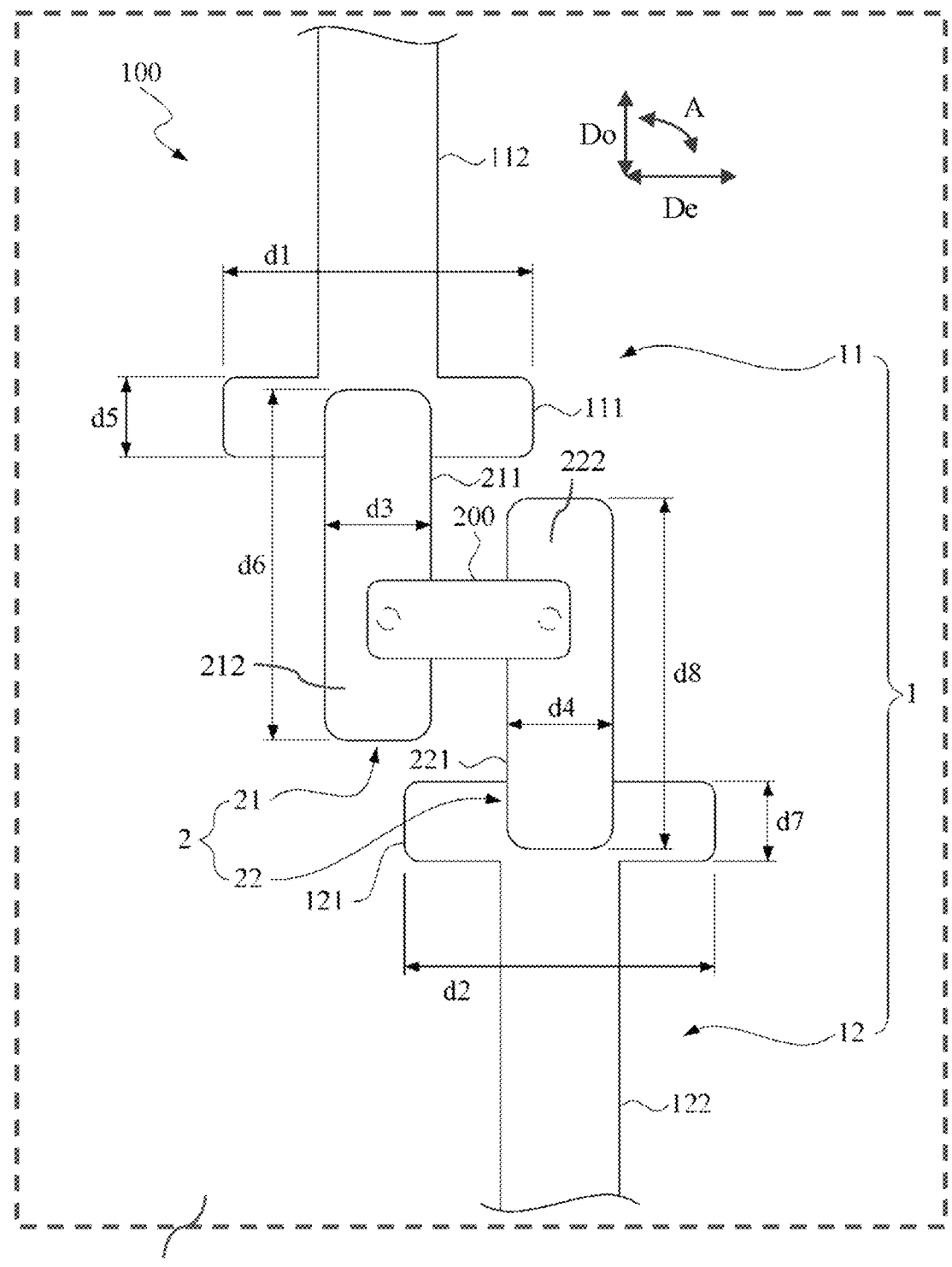
FIG. 3 is a schematic diagram illustrating a layout of an illuminating circuit structure of a first preferred embodiment according to the invention.

Please refer to FIG. 3, which is a schematic diagram illustrating a layout of an illuminating circuit structure 100 of a first preferred embodiment according to the invention. As shown by FIG. 3, the illuminating circuit structure 100 for backlight includes a printed baseline layer 1 and a printed pad layer 2 successively printed on a film sheet 101 for electrically connecting with a pair of positive and negative electrodes of an illuminant 200. The illuminants mentioned in the following embodiments of the present invention may be, for example, a packaged light-emitting diode (LED) package, or a light-emitting diode bare die that requires a subsequent packaging process. Various embodiments of the present invention have verified that the printing process yield of the film sheets for micro illuminants such as mini-LEDs or micro-LEDs can be improved.

The printed baseline layer 1 includes a first baseline segment 11 and a second baseline segment 12, which can be obtained with slurry containing micro metallic flakes, such as silver slurry or copper slurry. The first baseline segment 11 includes a first baseline head 111 and a first baseline lead 112. The embodiments of the present invention define three directions: a baseline direction Do as the extension direction of first baseline segments 11, 11a-11g, 12g, 13g, 11h, 12h and 13h; an electrode connection direction De as the direction of connection line passing through the positive and negative electrodes, which may be parallel to the baseline direction Do (e.g. in FIGS. 11, 14 and 15) or non-parallel to the baseline direction Do (e.g. in FIGS. 3, 4, 8, 9, 10, 12 and 13); a bridging direction Db. In the case that the electrode connection direction De is non-parallel to the baseline direction Do, the electrode connection direction De and the baseline direction Do form a tolerance included angle from 60 to 120 degrees; the tolerance included angle may be close to 90 degrees in some embodiments. The bridging direction Db and the baseline direction Do are non-parallel to each other (e.g. in FIGS. 11, 14 and 15), so that the bridging direction Db and the baseline direction Do form a tolerance included angle from 60 to 120 degrees; the tolerance included angle may be close to 90 degrees in some embodiments. In FIG. 3, the first baseline head 111 extends in the bridging direction Db. The first baseline lead 112 extends in the baseline direction Do and is integrally connected to the middle portion of the first baseline lead 111 to forma T-shaped branch structure as a fault tolerance design. Therein, the first baseline head 111 has a first length d1 in the bridging direction Db and a fifth length d5 in the baseline direction Do. The first length d1 of the first baseline head 111 is much greater than the fifth length d5 or the width of the first baseline lead 112, e.g. 1.5, 2 or above 2.5 times, in order to achieve a tolerance of printing shifting, and ensure that the branch structure will not extend to the illuminant 200, or even to reach in the orthographic projection of the illuminant 200. In FIG. 3, the electrode connection direction De of (the positive and negative electrodes of) the illuminant 200 is parallel to the bridging direction Db, or the included angle formed by the electrode connection direction De and the bridging direction Db is less than 30 degrees. In addition, the electrode connection direction De is non-parallel to the baseline direction Do, which forms the above tolerance included angle.

The second baseline segment 12 and the first baseline segment 11 extend in parallel in the baseline direction Do. There is a considerable distance between the second baseline segment 12 and the first baseline segment 11 in the baseline direction Do and the electrode connection direction De. The second baseline segment 12 includes a second baseline head 121 and a second baseline lead 122. The second baseline head 121 extends in the bridging direction Db. The second baseline lead 122 extends in the baseline direction Do and is integrally connected to the middle portion of the second baseline head 121. Because of the tolerance included angle A of the baseline direction Do and the electrode connection direction De, the first baseline head 111 on the first baseline segment 11 forms the T-shaped branch structure relative to the first baseline lead 112 as a fault tolerance design; therein, the second baseline head 121 has a second length d2 in the bridging direction Db and a seventh length d7 in the baseline direction Do, and the second length D2 is considerably greater than the seventh length d7.

The printed pad layer 2 includes a first pad (bar shape) 21 and a second pad (bar shape) 22, which can also be realized by plastics containing micron or nanoscale metal particles of gold, silver, copper, nickel, or a combination thereof. The conductivity of the printed pad layer 2 may be higher than that of the printed baseline layer 1. The first pad 21 includes a rear end 211 and a front end 212. Therein, the rear end 211 extends in the baseline direction Do and overlaps the middle portion of the first baseline head 111. The rear end 211 has a third length d3 in the electrode connection direction De, less than the first length d1, and a sixth length d6 in the baseline direction Do, greater than the fifth length d5.

The second pad (bar shape) 22 includes a rear end 221 and a front end 222. The rear end 221 extends in the baseline direction Do and overlaps the middle portion of the second baseline head 121. The rear end 221 has a fourth length d4 in the electrode connection direction De, less than the second length d2, and an eighth length d8 in the baseline direction Do, greater than the seventh length d7. In the embodiments of the present invention, the front ends 212, 212b, 212c, 212e, 212g, 232g, 212h, 232h of the first pad 21 or the front ends 222, 222b, 222c, 222e, 242g, 262g of the second pad 22 are perpendicular to the electrode connection direction De in principle. In FIG. 3, the front end 212 or the front end 222 also extends in baseline direction Do. In principle, in the embodiments of the present invention, the front ends 212, 212b, 212c, 212e, 212g, 232g, 212h, 232h of the first pad 21 and the front ends 222, 222b, 222c, 222e, 242g, 262g of the second pad 22 are not provided with a branch structure of circuit printing, so as to improve the print shifting problem of the printed pad layer, which can reduce the circuit density in the orthographic projection of the illuminant 200 and around the illuminant 200 and improve the process yield, and also avoid limitations of the circuit layout on the relative position of the illuminant 200 and the corresponding light-emitting keycap.

As mentioned above, the rear end 211 of the first pad (bar shape) 21 is used to be superimposed up and down and then attached to a first electrode (shown by a dotted circle on the left side of the illuminant 200 in the figure) of the illuminant 200, and the rear end 221 of the second pad (bar shape) 22 is used to be superimposed up and down and then attached to a second electrode (shown by a dotted circle on the right side of the illuminant 200 in the figure) of the illuminant 200, so as to form electrical connections so that the circuit connected to the first baseline segment 11 and the second baseline segment 12 can conduct the illuminant 200. The first baseline segment 11 of the illuminating circuit structure 100 is a circuit of the printed baseline layer 1 formed on the film sheet 101, for example, by printing. Then, the printed pad layer 2 is coated on the film sheet 101 and the printed baseline layer 1 by screen printing; therein, the printed pad layer 2 is partially on the printed baseline layer 1. The film sheet 101 can be made of, for example, PE (polyethylene), PC (polycarbonate), PP (polypropylene), PI (polyimide), PVC (polyvinyl chloride), and PET (polyethylene terephthalate) Or other polymer film plastics. Furthermore, solder paste can still be used for electrical connection between the printed pad layer 2 and the illuminant 200. The solder paste can be realized by, for example, a tin-bismuth alloy, a tin-silver-copper alloy, or a combination thereof.

Figure 4:
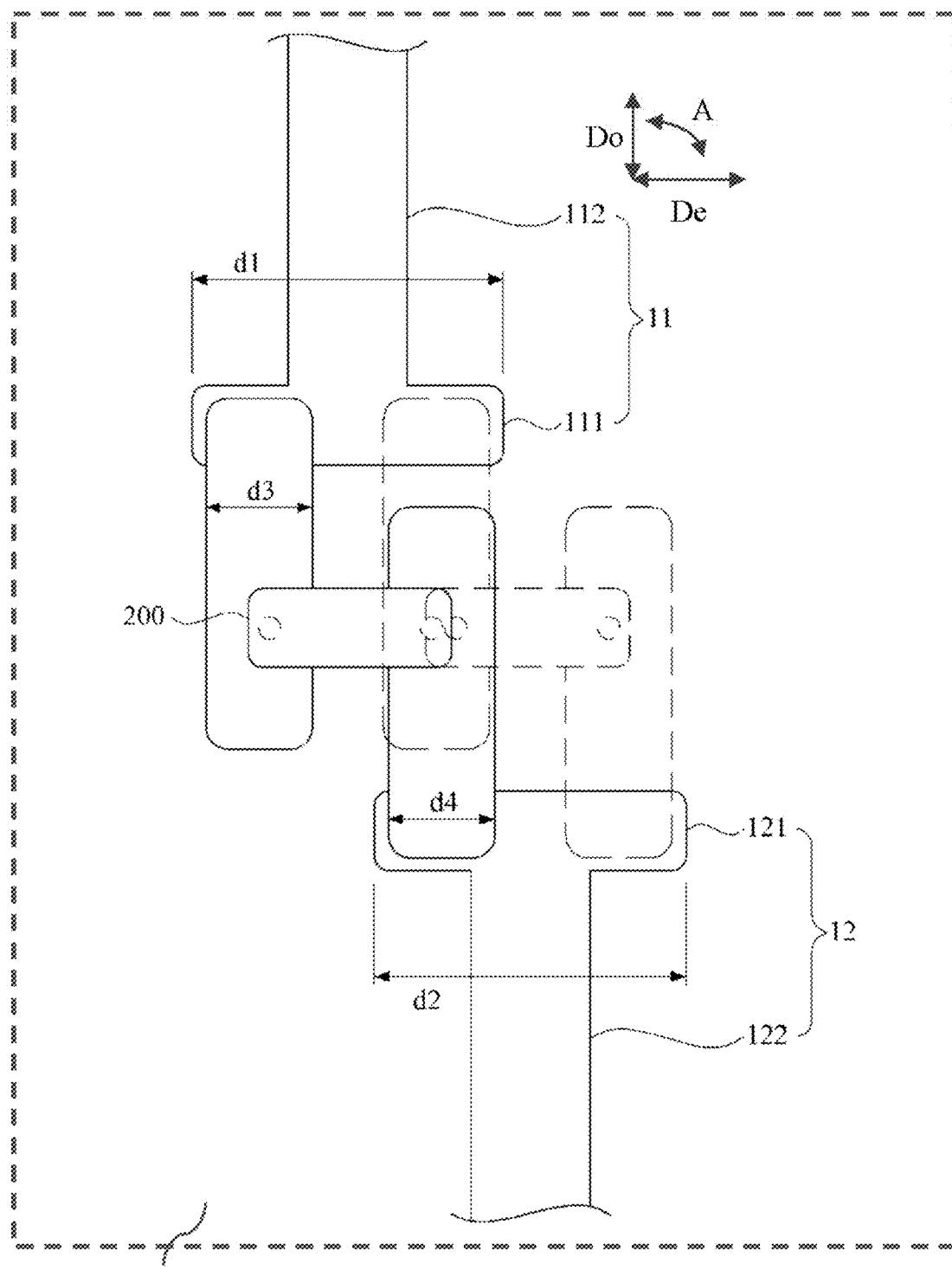
FIG. 4 is a schematic diagram illustrating the illuminating circuit structure of the first preferred embodiment according to the invention, in which by extending a first baseline head and a second baseline head in the first direction, the allowable printing range of a printed pad layer during printing is increased.

Please continue to refer to FIG. 4, which is a schematic diagram illustrating the illuminating circuit structure of the first preferred embodiment according to the invention, in which by extending the first baseline head 111 and the second baseline head 121 in the electrode connection direction De to increase the allowable printing range of the printed pad layer 2 during printing.

As shown by FIG. 3 and FIG. 4, the first baseline head 111 and the second baseline head 121 extend in the electrode connection direction De and respectively have the first length d1, greater than the third length d3 of the rear end 211 of the first pad 21, and the second length d2, greater than the fourth length d4 of the rear end 221 of the second pad 22, respectively, so during the printing and coating of the rear end 211 and the rear end 221 with the middle portions of the first baseline head 111 and the second baseline head 121 as the targets respectively, the ear end 211 and the rear end 221 can be formed on the first baseline head 111 and the second baseline head 121 within the ranges of the first length d1 and the third length d3 respectively even if deviation from the middle portions of the first baseline head 111 and the second baseline head 121 due to process errors occurs. That is, the design that the first baseline head 111 and the second baseline head 121 extend along the electrode connection direction De can effectively improve the allowable error range of the printed pad layer 2 in the printing process, thereby effectively preventing the printed pad layer 2 from being unable to touch the printed pad layer 2 due to errors, and relatively improving the process yield of the illuminating circuit structure 100.

Furthermore, in the baseline direction Do, the rear end 211 of the first pad 21 and the rear end 221 of the second pad 22 have the sixth length d6, greater than the fifth length d5 of the first baseline head 111, and the eighth length d8 greater than the seventh length d7 of the second baseline head 121, respectively, so the rear end 211 and the rear end 221 can be effectively used as extensions of the first baseline head 111 and the second baseline head 121, respectively, for the illuminant 200 to subsequently set.

Figure 5:
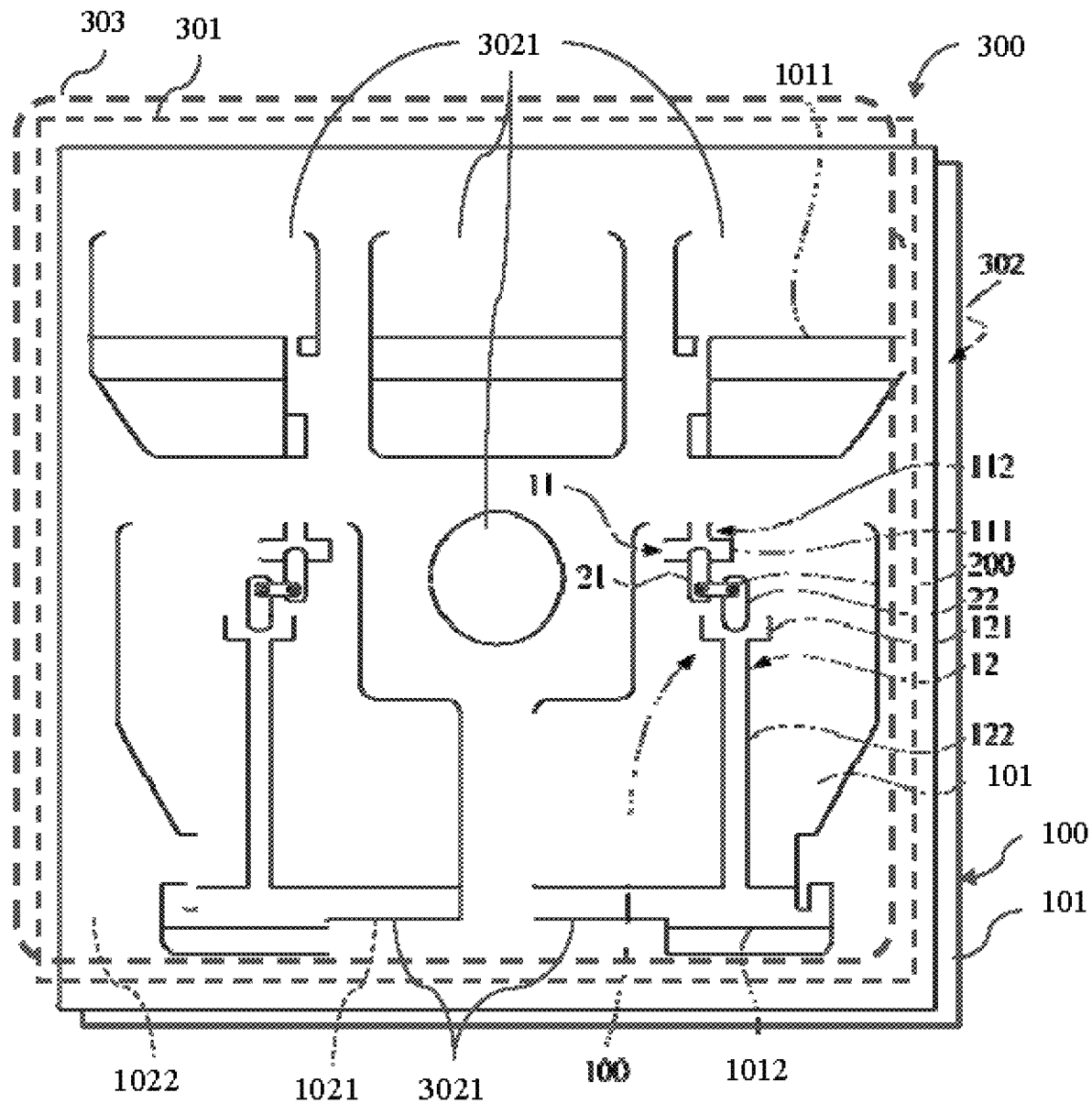
FIG. 5 is a schematic diagram illustrating a layout of a keyboard module with the illuminating circuit structure of the first preferred embodiment according to the invention.

Please continue to refer to FIG. 5, which is a schematic diagram illustrating a layout of a keyboard module with the illuminating circuit structure of the first preferred embodiment according to the invention. As shown by FIG. 3 and FIG. 5, in practice, the illuminating circuit structure 100 of the present invention can be applied to an electronic device such as a keyboard module 300. The keyboard module 300 includes a circuit membrane 301, a keyboard base frame 302, a keycap 303, and a support assembly 304 (referring to FIG. 6 for the latter two). The keycap 303 is assembled to the keyboard base frame 302 through the support assembly 304. The circuit membrane 301 can be disposed above or below the keyboard base frame 302. The circuit membrane 301 is provided with membrane switches (not shown) corresponding to each keycap 303. The membrane switches are connected to each other to form a key circuit. When the membrane switch on the circuit membrane 301 is triggered as the keycap 303 is pressed down, a corresponding key signal can be generated. The illuminating circuit structure 100, which plays the role of backlight, and the film sheet 101 thereof are located below the keyboard base frame 302 of the keyboard module 300.

Furthermore, the circuit membrane 301 includes a first circuit trace 1011 and a second circuit trace 1012. The first circuit trace 1011 is turned on through a key pressing. The first baseline lead 112 and the second baseline lead 122 of the illuminating circuit structure 100 are electrically connected to the first circuit trace 1011 and the second circuit trace 1012 respectively. Thereby, when the key is pressed, the first circuit trace 1011 is turned on to send a key signal, so that a current can pass through the illuminant 200 through the illuminating circuit structure 100 so as to make the illuminant 200 emit light. It should be noted that, since the light generated by the illuminant 200 must pass through a through hole 3021 of the keyboard base frame 302 and circuit gaps on the circuit membrane 301 and be refracted or reflected by the support assembly 304, and then can pass through the keycap 303, in order to achieve the best key top lighting effect, it is inappropriate to design complex circuit around the illuminant 200, so as to not limit the layout of the illuminant 200 and also to avoid the problems of overflowing, print shifting, and circuit shorting that may occur in the printing process and affect the process yield. Therefore, the first pad (bar shape) 21 and the second pad (bar shape) 22 of the printed pad layer 2 are not suitable for forming a T-shaped or L-shaped bending structure in the overlapping part with the orthographic projection of the illuminant 200 or around the illuminant 200, and enlarging area. In other words, only the first baseline head 111 and the second baseline head 121 of the printed baseline layer 1, and the rear end 211 of the first pad 21 and the rear end 221 of the second pad 22 of the printed pad layer 2 are suitable for branch structures such as T-shaped or L-shaped bending structures of a fault tolerance design. In contrast, adding additional circuit structures to the front end 212 of the first pad 21 or the front end 222 of the second pad 22 may reduce the yield and limit the location range for the illuminant, and is not suitable for forming branch structures. The front end 212 and the front end 222 except for the branch structures are located in the orthographic projection of the illuminant 200 or around the orthographic projection. Similarly, the first length d1 of the first baseline head 111 is preferably several times (such as more than 3 times) greater than the fifth length d5 at a multiple ratio, and the second length d2 of the second baseline head 121 is preferably several times greater than the seventh length d7. The smaller first length d1 and second length d2 can prevent the branch structures from being close to the illuminant 200, or even entering the orthographic projection of the illuminant 200.

Figure 6:
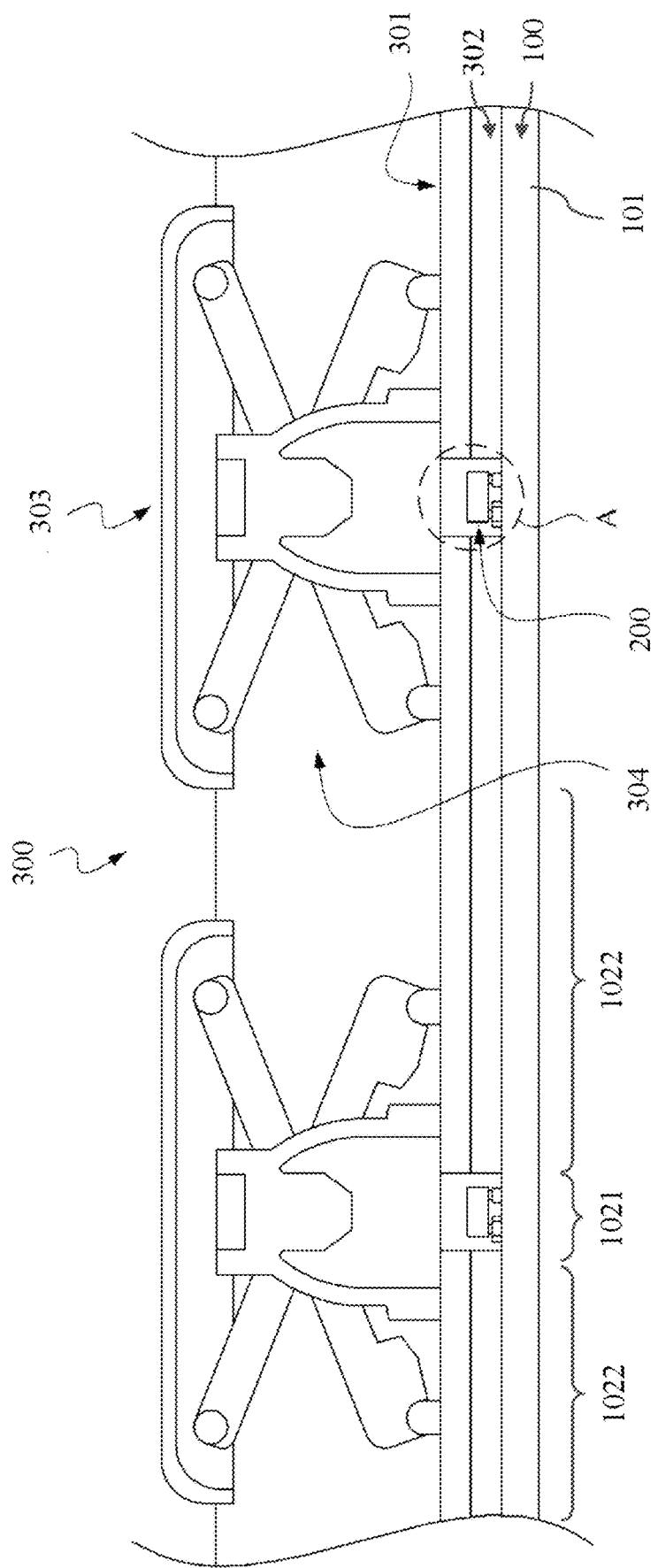
FIG. 6 is a sectional view of another keyboard module with the illuminating circuit structure of the first preferred embodiment according to the invention.
Figure 7:
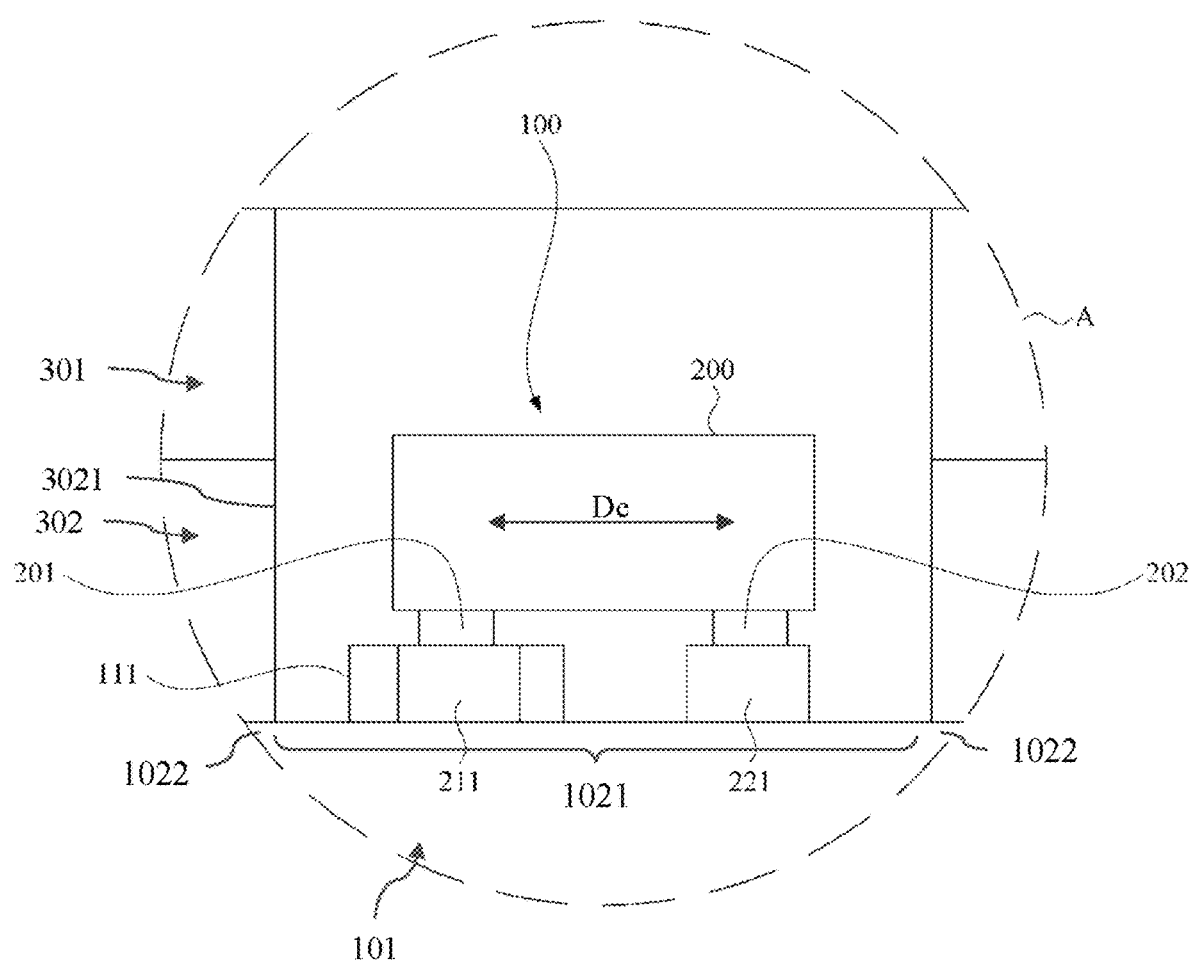
FIG. 7 is an enlarged view of the circle A in FIG. 6.

Please continue to refer to FIG. 6 and FIG. 7. FIG. 6 is a sectional view of another keyboard module with the illuminating circuit structure of the first preferred embodiment according to the invention. FIG. 7 is an enlarged view of the circle A in FIG. 6. First of all, please refer to FIG. 6 and FIG. 7 together for the location configuration of the illuminant 200. The light generated by the illuminant 200 enters the keyboard module 300 through one or more through holes 3021 of the keyboard base frame 302. The projections of these through holes 3021 on the film sheet 101 of the illuminating circuit structure 100 define permeable light entry projections 1021 and impermeable light entry gap projections 1022. The illuminant 200 of each embodiment of the present invention can be selectively disposed in the light entry projection 1021 on the film sheet 101, so that the light can be directly emitted upwards corresponding to some through hole 3021; alternatively, the illuminant 300 can be disposed in the light entry gap projection 1022, so that the light can be transmitted laterally through a light-guiding plate (not shown in the figures) to a portion of the light-guiding plate corresponding to the light entry projection 1021 and then be emitted upward into the keyboard module 300. More specifically, the light emitted by the illuminant 200 can travel directly upwards at the light entry projection, but cannot travel upwards at the light entry gap projection. From another point of view, the above light entry projections are all located within the projection of the corresponding keycap 303 on the film sheet 101 (the range bounded by the outline of the keycap 303 projected on the film sheet 101), and the light entry gap projections cover the area under the peripheral clearance between the adjacent two keycaps 303.

As shown by FIG. 3, FIG. 6 and FIG. 7, the illuminating circuit structure 100 of the present invention can also be applied to another keyboard module 300 in practice. The keyboard module 300 includes a circuit membrane 301, a support assembly 304 and a keycap 303. The circuit membrane 301 is actually a circuit substrate. The support assembly 304 is disposed on the circuit membrane 301. The keycap 303 is assembled to the support assembly 304. Therein, the illuminating circuit structure 100 of the present invention is disposed on the circuit membrane 301. It can be known from FIG. 6 and FIG. 7 that the first electrode 201 and the second electrode 202 of the illuminant 200 are attached to the rear end 211 of the first pad 21 and the rear end 221 of the second pad 22 respectively.

Figure 8:
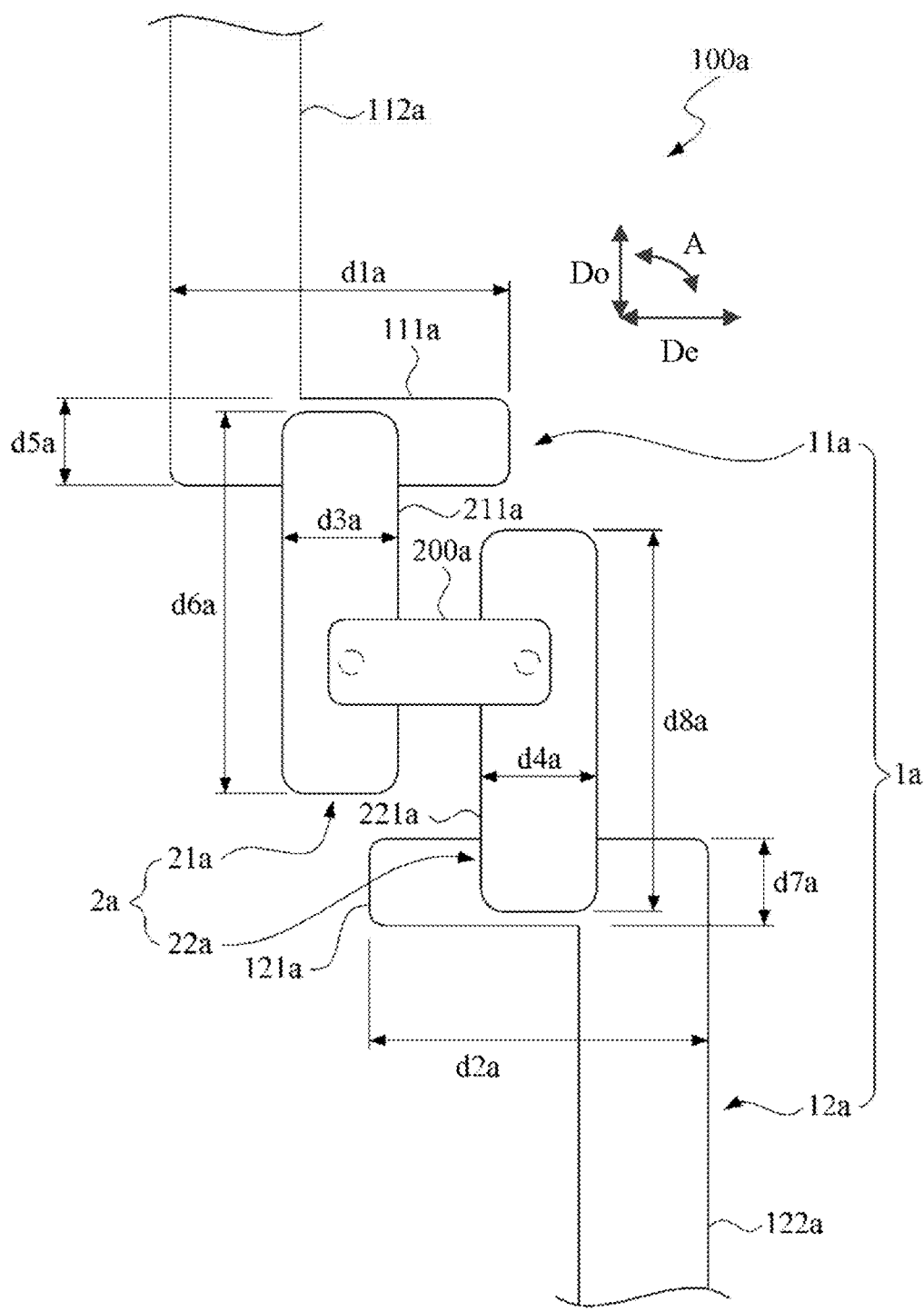
FIG. 8 is a schematic diagram illustrating a layout of an illuminating circuit structure of a second preferred embodiment according to the invention.

Please refer to FIG. 8, which is a schematic diagram illustrating a layout of an illuminating circuit structure of a second preferred embodiment according to the invention. An illuminating circuit structure 100a includes a printed baseline layer 1a and a printed pad layer 2a which are printed on a film sheet (not shown), for electrically connecting with a pair of positive and negative electrodes of the illuminant 200a.

The printed baseline layer 1a includes a first baseline segment 11a and a second baseline segment 12a. The first baseline segment 11a includes a first baseline head 111a and a first baseline lead 112a. The first baseline head 111a extends in the electrode connection direction De. The first baseline lead 112a extends in the baseline direction Do which is nearly perpendicular to the electrode connection direction De, and is integrally connected to an end of the first baseline head 111a. Therein, the first baseline head 111a has a first length d1a in the electrode connection direction De and a fifth length d5a in the baseline direction Do. Since the baseline direction Do and the electrode connection direction De form a tolerance included angle A, an L-shaped branch structure is formed by the first baseline head 111a on the first baseline segment 11a relative to the first baseline lead 112a.

The second baseline segment 12a includes a second baseline head 121a and a second baseline lead 122a. The second baseline head 121a extends in the electrode connection direction De. The second baseline lead 122a extends in the baseline direction Do and is integrally connected to an end of the second baseline head 121a. Therein, the second baseline head 121a has a second length d2a in the electrode connection direction De and a seventh length d7a in the baseline direction Do.

The printed pad layer 2a includes a first pad (bar shape) 21a and a second pad (bar shape) 22a. The first pad 21a includes a rear end 211a. The rear end 211a overlaps the middle portion of the first baseline head 111a and has a third length d3a in the electrode connection direction De which is less than the first length d1a. The first pad 21a as a whole has a sixth length d6a in the baseline direction Do. The sixth length d6a is greater than the fifth length d5a, and the fifth length d5a is less than the first length d1a, which ensures that the branch structure is not close to the illuminant 200a. The second pad 22a includes a rear end 221a. The rear end 221a overlaps the second baseline head 121a and has a fourth length d4a in the electrode connection direction De which is less than the second length d2a. The second pad 22a as a whole has an eighth length d8a in the baseline direction Do which is greater than the seventh length d7a. Since the branch structures in FIG. 8 are disposed on the first baseline head 111a and the second baseline head 121a away from the illuminant 200a, the front end 212a of the first pad 21a and the front end 222a of the second pad 22a except for the branch structures are located in the orthographic projection of the illuminant 200a or around the orthographic projection.

As described above, the rear end 211a of the first pad 21a is used to be connected to a first electrode (not labeled in the figure) of an illuminant 200a, and the rear end 221a of the second pad 22a is used to be connected to a second electrode of the illuminant 200a (not labeled in the figure). Thereby, the circuit connecting with the first baseline segment 11a and the second baseline segment 12a can turn on the illuminant 200a.

Figure 9:
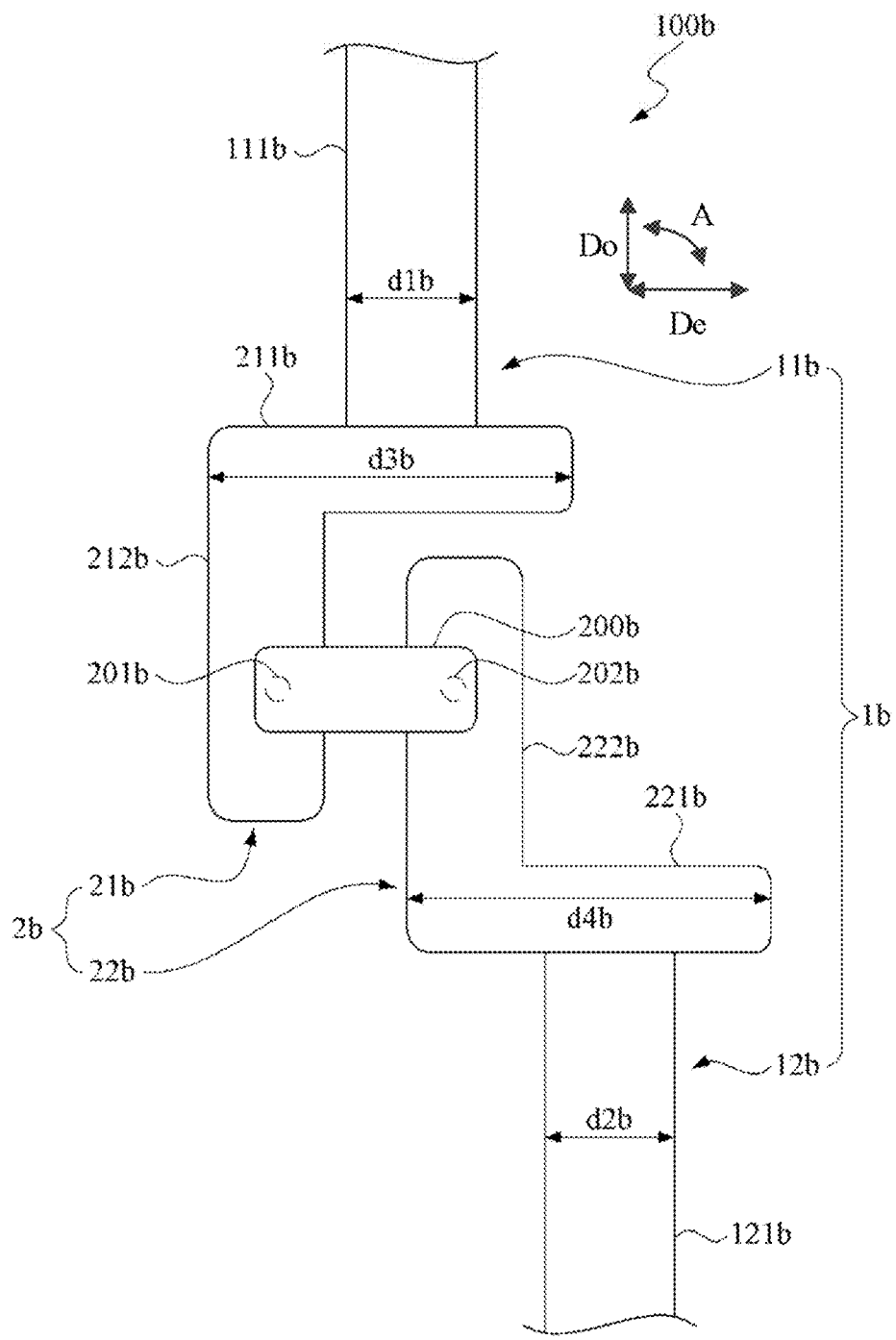
FIG. 9 is a schematic diagram illustrating a layout of an illuminating circuit structure of a third preferred embodiment according to the invention.

Please refer FIG. 9, which is a schematic diagram illustrating a layout of an illuminating circuit structure of a third preferred embodiment according to the invention. An illuminating circuit structure 100b includes a printed baseline layer 1b and a printed pad layer 2b which are printed on a film sheet (not shown), for electrically connecting with a pair of positive and negative electrodes 201b/202b of the illuminant 200b.

The printed baseline layer 1b includes a first baseline segment 11b and a second baseline segment 12b. The first baseline segment 11b includes a first baseline head 111b. The first baseline head 111b extends in the baseline direction Do. The first baseline head 111b has a first length d1b in the electrode connection direction De which is nearly perpendicular to the baseline direction Do.

The second baseline segment 12b includes a second baseline head 121b. The second baseline head 121b extends in the baseline direction Do. The second baseline head 121b has a second length d2b in the electrode connection direction De.

The printed pad layer 2b includes a first pad (bar shape) 21b and a second pad (bar shape) 22b. The first pad 21b includes a rear end 211b and a front end 212b. The rear end 211b extends in the electrode connection direction De and has a third length d3b in the electrode connection direction De which is greater than the first length d1b. The middle portion of the rear end 211b overlaps an end portion of the first baseline head 111b. The front end 212b extends in the baseline direction Do and is integrally connected to an end portion of the rear end 211b.

The second pad (bar shape) 22b includes a rear end 221b and a front end 222b. The rear end 221b extends in the electrode connection direction De and has a fourth length d4b in the electrode connection direction De which is greater than the second length d2b. The middle portion of the rear end 221b overlaps an end portion of the second baseline head 121b. The front end 222b extends in the baseline direction Do and is integrally connected to an end portion of the rear end 221b. Since the baseline direction Do and the electrode connection direction De form a tolerance included angle A, an L-shaped branch structure is formed by the rear end 211b on the first pad 21b relative to the front end 212b. Furthermore, the rear end 211b of the first pad 21b and the rear end 221b of the second pad 22b extend rightwards in FIG. 9 (parallel to the electrode connection direction De); therefore, although the first pad 21b and the second pad 22b have the same shape, they do not need to be limited to be symmetrically arranged with each other.

Continuing from the above, the front end 212b of the first pad 21b is used to be connected to a first electrode 201b of the illuminant 200b, and the front end 222b of the second pad 22b is used to be connected to a second electrode 202b of the illuminant 200b, so that the circuit connected to the first baseline segment 11b and the second baseline segment 12b can turn on the illuminant 200b. Furthermore, the illuminating circuit structure 100b of this embodiment mainly has the third length d3b greater than the first length d1b in the electrode connection direction De through the rear end 211b of the first pad 21b, and has the fourth length d4b greater than the second length d2b in the electrode connection direction De through the rear end 221b of the second pad 22b. For example, the third length d3b is 1.52.5 times greater than the first length d1b, and the fourth length d4b can also be 1.52.5 times greater than the second length d2b, so that when the printed pad layer 2b is formed by use of a printing coating process, there is a tolerance of printing in the electrode connection direction De for the printed pad layer 2b, effectively preventing the printed pad layer 2b from being unable to contact the printed baseline layer 1b due to inaccurate printing, and relatively improving the process of the illuminating circuit structure 100b. Since the branch structures in FIG. 9 are disposed on the rear end 211b of the first pad 21b and the rear end 221b of the second pad 22b away from the illuminant 200b, the front end 212b of the first pad 21b and the front end 222b of the second pad 22b except for the branch structures are located in the orthographic projection of the illuminant 200b or around the orthographic projection.

Figure 10:
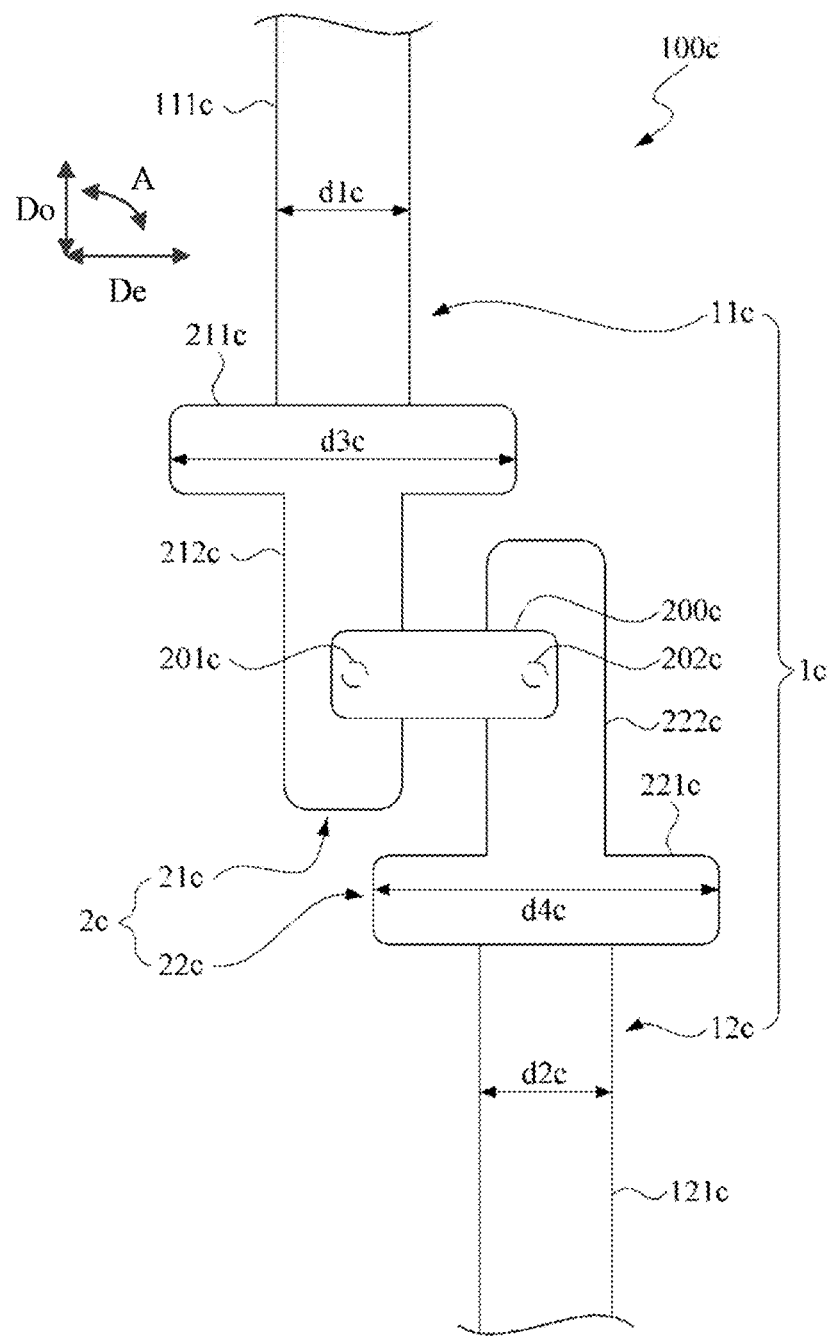
FIG. 10 is a schematic diagram illustrating a layout of an illuminating circuit structure of a fourth preferred embodiment according to the invention.

Please refer to FIG. 10, which is a schematic diagram illustrating a layout of an illuminating circuit structure of a fourth preferred embodiment according to the invention. An illuminating circuit structure 100c includes a printed baseline layer 1c and a printed pad layer 2c which are printed on a film sheet (not shown).

The printed baseline layer 1c includes a first baseline segment 11c and a second baseline segment 12c. The first baseline segment 11c includes a first baseline head 111c. The first baseline head 111c extends in the baseline direction Do. The first baseline head 111c has a first length d1c in the electrode connection direction De which is nearly perpendicular to the baseline direction Do.

The second baseline segment 12c includes a second baseline head 121c. The second baseline head 121c extends in the baseline direction Do. The second baseline head 121c has a second length d2c in the electrode connection direction De.

The printed pad layer 2c includes a first pad (bar shape) 21c and a second pad (bar shape) 22c. The first pad 21c includes a rear end 211c and a front end 212c. The rear end 211c extends in the electrode connection direction De and has a third length d3c in the electrode connection direction De which is greater than the first length d1c. The middle portion of the rear end 211c overlaps an end portion of the first baseline head 111c. The front end 212c extends in the baseline direction Do and is integrally connected to an end portion of the rear end 211c. Since the baseline direction Do and the electrode connection direction De forma tolerance included angle A, a T-shaped branch structure is formed by the rear end 211c relative to the front end 212c.

The second pad (bar shape) 22c includes a rear end 221c and a front end 222c. The rear end 221c extends in the electrode connection direction De and has a fourth length d4c in the electrode connection direction De which is greater than the second length d2c. The middle portion of the rear end 221c overlaps an end portion of the second baseline head 121c. The front end 222c extends in the baseline direction Do and is integrally connected to an end portion of the rear end 221c.

Continuing from the above, the front end 212c of the first pad 21c is used to be connected to a first electrode 201c of an illuminant 200c, and the front end 222c of the second pad 22c is used to be connected to a second electrode 202c of the illuminant 200b, so that the circuit connected to the first baseline segment 11c and the second baseline segment 12c can turn on the illuminant 200c. Since the branch structures in FIG. 10 are disposed on the rear end 211c of the first pad 21c and the rear end 221c of the second pad 22c away from the illuminant 200c, the front end 212c of the first pad 21c and the front end 222c of the second pad 22c except for the branch structures are located in the orthographic projection of the illuminant 200c or around the orthographic projection.

Furthermore, the illuminating circuit structure 100c of this embodiment mainly has the third length d3c greater than the first length d1c in the electrode connection direction De through the rear end 211c of the first pad 21c, and has the fourth length d4c greater than the second length d2c in the electrode connection direction De through the rear end 221c of the second pad 22c, so that when the printed pad layer 2c is formed by use of a printing coating process, there is a tolerance of printing in the electrode connection direction De for the printed pad layer 2c, effectively preventing the printed pad layer 2c from being unable to contact the printed baseline layer 1b due to inaccurate printing, and relatively improving the process of the illuminating circuit structure 100c.

Figure 11:
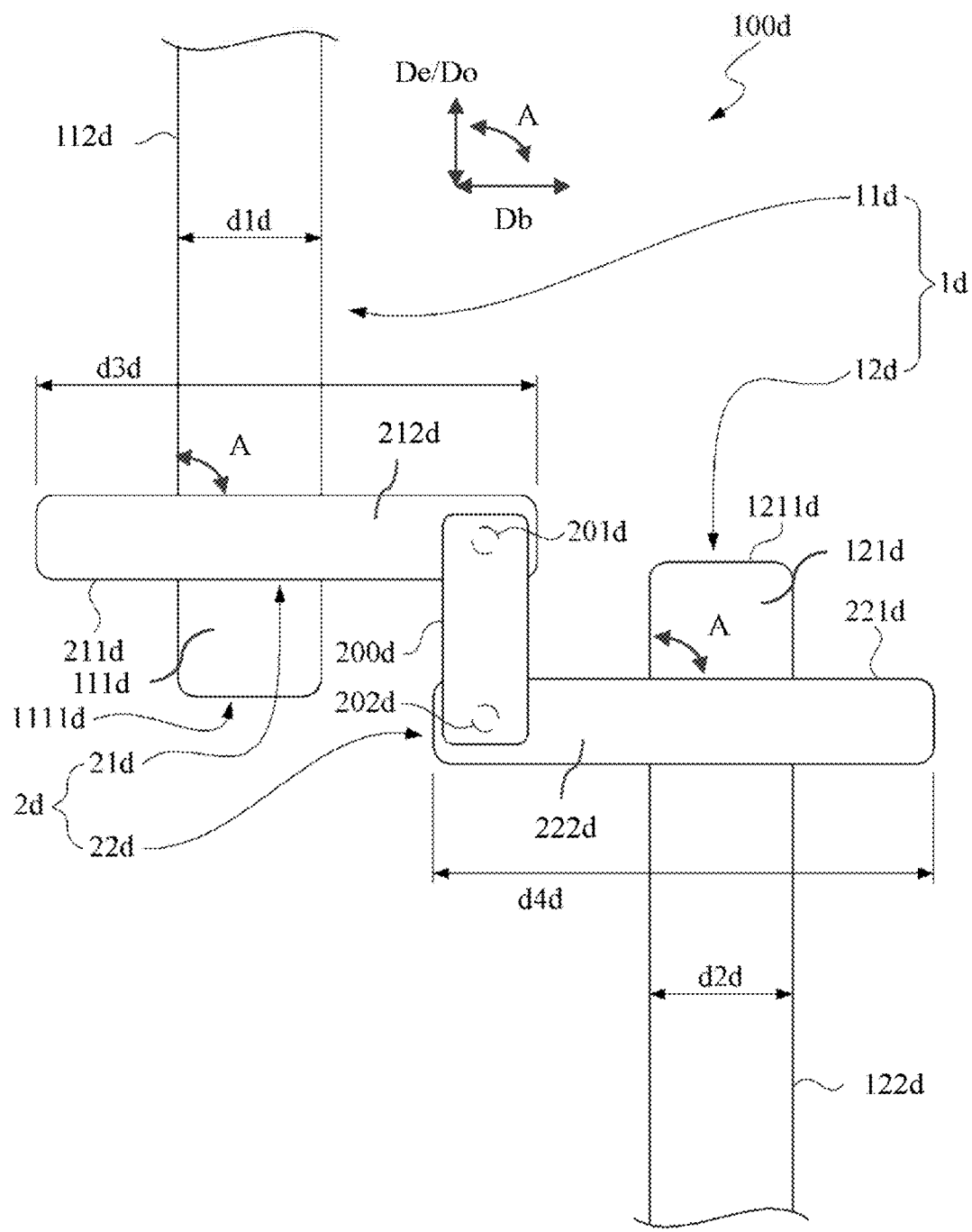
FIG. 11 is a schematic diagram illustrating a layout of an illuminating circuit structure of a fifth preferred embodiment according to the invention.

Please refer to FIG. 11, which is a schematic diagram illustrating a layout of an illuminating circuit structure of a fifth preferred embodiment according to the invention. An illuminating circuit structure 100d includes a printed baseline layer 1d and a printed pad layer 2d which are printed on a film sheet (not shown).

The printed baseline layer 1d includes a first baseline segment 11d and a second baseline segment 12d. The first baseline segment 11d includes a first baseline head 111d. The first baseline head 111d extends in the electrode connection direction De. The first baseline head 111d has a first length did in the bridging direction Db. The bridging direction Db and the electrode connection direction De form a tolerance included angle A and are nearly perpendicular. Therein, the first baseline head 111d has an edge 1111d.

The second baseline segment 12d includes a second baseline head 121d. The second baseline head 121d extends in the electrode connection direction De. The second baseline head 121d has a second length d2d in the bridging direction Db. Therein, the second baseline head 121d has an edge 1211d.

The printed pad layer 2d includes a first pad (bar shape) 21d and a second pad (bar shape) 22d. The first pad 21d includes a rear end 211d and a front end 212d. The first pad 21d as a whole extends straightly in the bridging direction Db. The first pad 21d has a third length d3d in the bridging direction Db, which is greater than the first length d1d. The rear end 211d of the first pad 21d is spaced apart from the edge 1111d and overlaps the first baseline head 111d. That is, the first baseline head 111d and the rear end 211d of the first pad 21d form a cross-shaped branch structure that has the tolerance included angle A.

The second pad (bar shape) 22d includes a rear end 221d and a front end 222d. The second pad 22d as a whole extends in the bridging direction Db. The second pad 22d has a fourth length d4d in the bridging direction Db, which is greater than the second length d2d. The rear end 221d is spaced apart from the edge 1211d and overlaps the second baseline head 121d. That is, the second baseline head 121d and the rear end 221d of the second pad 22d form a cross-shaped branch structure that also has the tolerance included angle A.

Continuing from the above, the front end 212d of the first pad 21d is used to be connected to a first electrode 201d of an illuminant 200d, and the front end 222d of the second pad 22d is used to be connected to a second electrode 202d of the illuminant 200b, so that the circuit connected to the first baseline segment 11d and the second baseline segment 12d can turn on the illuminant 200d. In this embodiment, the illuminant 200d, the front end 212d of the first pad 21d, and the front end 222d of the second pad 22d are located between the first baseline segment 11d and the second baseline segment 12d which are substantially parallel. Therefore, a larger distance is required between the first baseline segment 11d and the second baseline segment 12d than in other embodiments. The first pad 21d and the second pad 22d will also have a longer overall length. The rear end 211d of the first pad 21d and the rear end 221d of the second pad 22d must be long enough to cross the first baseline segment 11d and the second baseline segment 12d, respectively. For example, the sum of the lengths of the first pad 21d and the second pad 22d in the bridging direction Db is greater than the distance between the first baseline segment 11d and the second baseline segment 12d. If necessary, in order to overcome the error in printing the baseline direction Do, the projections of the first baseline head 111d and the second baseline head 121d of the first baseline segment 11d and the second baseline segment 12d in their normal direction (i.e. the bridging direction Db) may overlap each other. However, this configuration will also make the overall occupied area larger, and relatively limit the flexibility of arranging the position of the illuminant 200d. Therefore, more consideration must be given when adopting this configuration.

Furthermore, the cross-shaped branch structures are not located in an orthographic projection of the illuminant 200d or around the orthographic projection. The front end 212d of the first pad 21d and the front end 222d of the second pad 22d except for the branch structures are located in the orthographic projection of the illuminant 200d or around the orthographic projection, in order to improve the printing yield.

The illuminating circuit structure 100d of this embodiment mainly has the third length d3d greater than the first length did in the bridging direction Db through the rear end 211d of the first pad 21d, and has the fourth length d4d greater than the second length d2d in the bridging direction Db through the rear end 221d of the second pad 22d, so that when the printed pad layer 2d is formed by use of a printing coating process, there is a tolerance of printing in the bridging direction Db for the printed pad layer 2d, effectively preventing the printed pad layer 2d from being unable to contact the printed baseline layer 1d due to inaccurate printing, and relatively improving the process of the illuminating circuit structure 100d.

Figure 12:
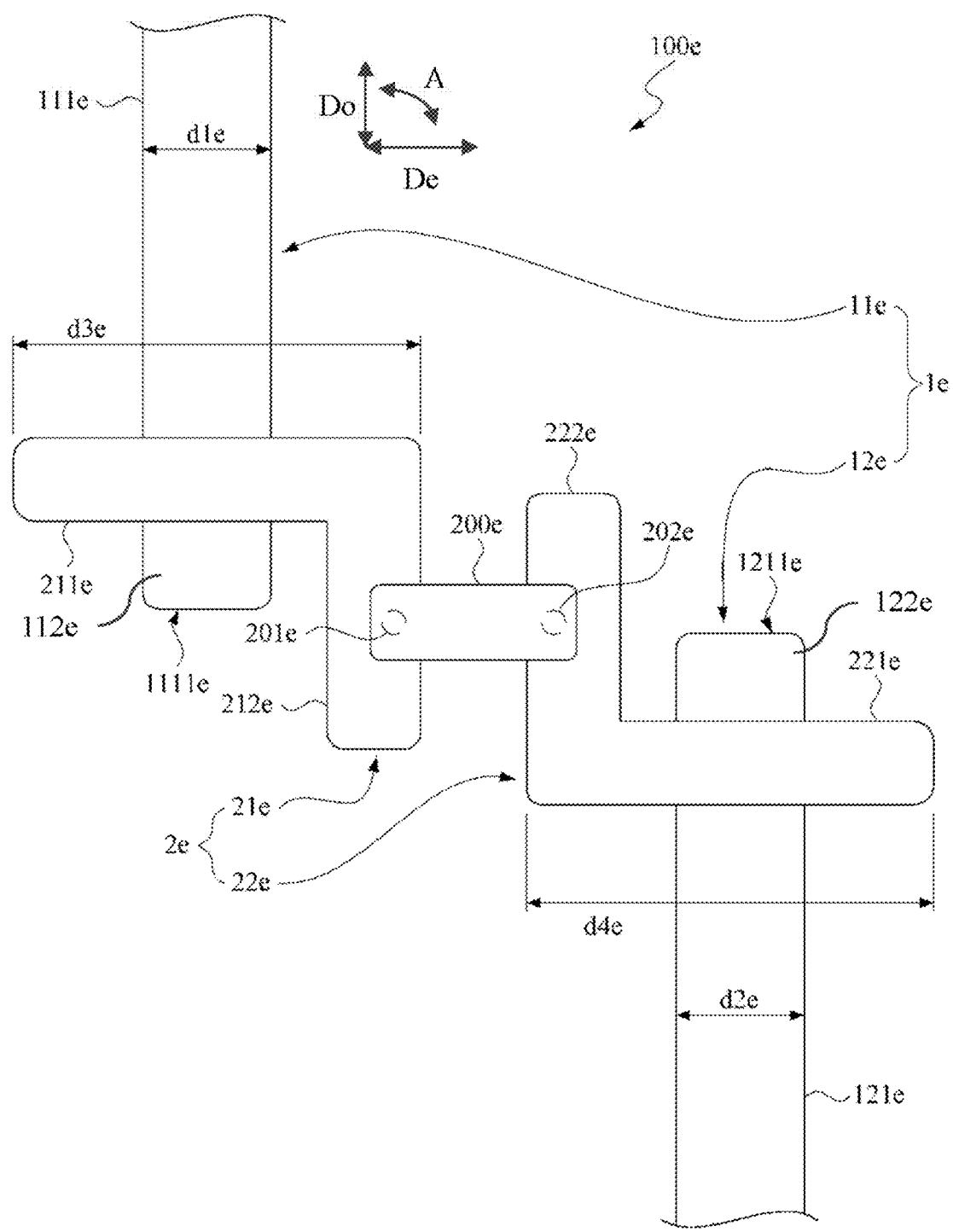
FIG. 12 is a schematic diagram illustrating a layout of an illuminating circuit structure of a sixth preferred embodiment according to the invention.

Please refer to FIG. 12, which is a schematic diagram illustrating a layout of an illuminating circuit structure of a sixth preferred embodiment according to the invention. An illuminating circuit structure 100e includes a printed baseline layer 1d and a printed pad layer 2e which are printed on a film sheet (not shown).

The printed baseline layer 1e includes a first baseline segment 11e and a second baseline segment 12e. The first baseline segment 11e includes a first baseline head 111e. The first baseline head 111e extends in the baseline direction Do. The first baseline head 111e has a first length d1e in the electrode connection direction De. Therein, the first baseline head 111e has an edge 1111e.

The second baseline segment 12e includes a second baseline head 121e. The second baseline head 121e extends in the baseline direction Do. The second baseline head 121e has a second length d2e in the electrode connection direction De. Therein, the second baseline head 121e has an edge 1211e.

The printed pad layer 2e includes a first pad (bar shape) 21e and a second pad (bar shape) 22e. The first pad 21e includes a rear end 211e and a front end 212e. The rear end 211e extends straightly in the electrode connection direction De, and has a third length d3e in the electrode connection direction De, which is greater than the first length d1e. The rear end 211e is spaced apart from the edge 1111e and overlaps the middle portion of the first baseline head 111. The front end 212e extends in the baseline direction Do and is integrally connected to the rear end 211e. Since the baseline direction Do and the electrode connection direction De form a tolerance included angle A, an L-shaped branch structure is formed by the rear end 211e on the first pad 21e relative to the front end 212e.

The second pad (bar shape) 22e includes a rear end 221e and a front end 222e. The rear end 221e extends in the electrode connection direction De, and has a fourth length d4e in the electrode connection direction De, which is greater than the second length d2e. The rear end 221e is spaced apart from the edge 1211e and overlaps the second baseline head 121e. The front end 222e extends in the baseline direction Do and is integrally connected to the rear end 221e. Furthermore, since the first baseline head 111e and the rear end 211e of the first pad 21e form a cross-shaped branch structure, a tolerance of printing shifting is allowed in both the electrode connection direction De and the baseline direction Do. The second baseline head 121e and rear end 222e of the second pad 22e may also have similar designs.

Continuing from the above, the front end 212e of the first pad 21e is used to be connected to a first electrode 201e of an illuminant 200e, and the front end 222e of the second pad 22e is used to be connected to a second electrode 202e of the illuminant 200e, so that the circuit connected to the first baseline segment 11e and the second baseline segment 12e can turn on the illuminant 200e. In this embodiment, the illuminant 200e, the front end 212e of the first pad 21e, and the front end 222e of the second pad 22e are located between the first baseline segment 11e and the second baseline segment 12e which are substantially parallel. Therefore, a larger distance is required between the first baseline segment 11e and the second baseline segment 12e than in other embodiments, and is slightly smaller than the distance between the first baseline segment 11d and the second baseline segment 12d in FIG. 11. The rear end 211e of the first pad 21e and the rear end 221e of the second pad 22e must be long enough to cross the first baseline segment 11e and the second baseline segment 12e, respectively. For example, the sum of the lengths of the illuminant 200e, the first pad 21e, and the second pad 22e in the electrode connection direction De is greater than the distance between the first baseline segment 11e and the second baseline segment 12e. If necessary, in order to overcome the error in printing the baseline direction Do, the projections of the first baseline head 111e and the second baseline head 121e of the first baseline segment 11e and the second baseline segment 12e in their normal direction (i.e. the electrode connection direction De) may overlap each other. However, similarly to FIG. 11, this configuration will also make the overall occupied area larger, and relatively limit the flexibility of arranging the position of the illuminant 200e. Therefore, more consideration must be given when adopting this configuration. Since the branch structures in FIG. 12 are located at the rear end 211e of the first pad 21e and the rear end 221e of the second pad 22e away from the illuminant 200e. The front end 212e of the first pad 21e and the front end 222e of the second pad 22e except for the branch structures are located in the orthographic projection of the illuminant 200e or around the orthographic projection.

On the whole, in the electrode connection direction De, the sum of the widths of the third length d3e of the rear end 211e of the first pad 21e and the illuminant 200e is greater than the distance between the inner sides of the first baseline segment 11e and second baseline segment 12e (even greater than the distance between the outer sides thereof), which can provide a fault tolerance in the electrode connection direction De during printing. Furthermore, the illuminating circuit structure 100e of this embodiment is similar to the above illuminating circuit structure 100e. Both of them provide fault tolerances in both the electrode connection direction De and the baseline direction Do during the process of using a printing coating process to form the printed pad layer 2e, mainly through the third length d3e, which is greater than the first length d1e, and the fourth length d4e, which is greater than the second length d2e. This can effectively prevent the printed pad layer 2e from being unable to contact the printed baseline layer 1e due to errors, and relatively improve the process yield of the illuminating circuit structure 100e.

Figure 13:
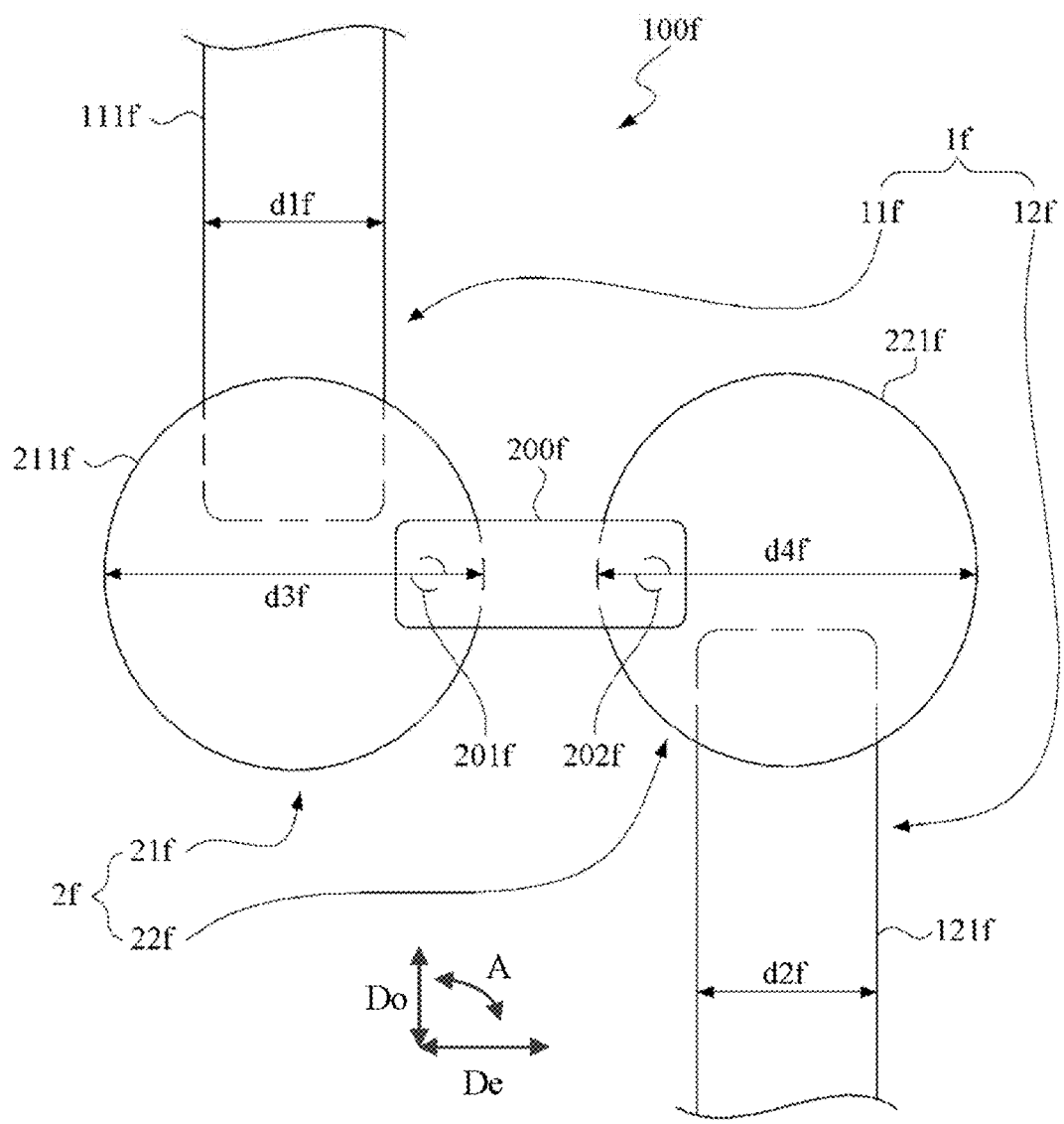
FIG. 13 is a schematic diagram illustrating a layout of an illuminating circuit structure of a seventh preferred embodiment according to the invention.

Please refer to FIG. 13, which is a schematic diagram illustrating a layout of an illuminating circuit structure of a seventh preferred embodiment according to the invention. An illuminating circuit structure 100f includes a printed baseline layer if and a printed pad layer 2f which are printed on a film sheet (not shown), for electrically connecting with a pair of electrodes of an illuminant 200f.

The printed baseline layer if includes a first baseline segment 11f and a second baseline segment 12f. The first baseline segment 11f includes a first baseline head 111f. The first baseline head 111f extends in the baseline direction Do. The first baseline head 111f has a first length d1f in the electrode connection direction De which is nearly perpendicular to the baseline direction Do.

The second baseline segment 12f includes a second baseline head 121f. The second baseline head 121f extends in the baseline direction Do. The second baseline head 121f has a second length d2f in the electrode connection direction De.

The printed pad layer 2f includes a first pad (round shape) 21f and a second pad (round shape) 22f. The first pad 21f includes a rear end 211f. The rear end 211f has a third length d3f in the bridging direction Db, which is greater than the first length d1f. The rear end 211f is connected to the first baseline head 111f.

The second pad (round shape) 22f includes a rear end 221f. The rear end 221f has a fourth length d4f in the bridging direction Db, which is greater than the second length d2f. The rear end 221f is connected to the second baseline head 121f.

Continuing from the above, the rear end 211f of the first pad 21d is used to be connected to a first electrode 201f of an illuminant 200f, and the rear end 221f of the second pad 22f is used to be connected to a second electrode 202f of the illuminant 200b, so that the circuit connected to the first baseline segment 11f and the second baseline segment 12f can turn on the illuminant 200f.

Therein, the illuminating circuit structure 100f of this embodiment provides a fault tolerances in the bridging direction Db during the process of using a printing coating process to form the printed pad layer 2f, mainly through the third length d3f, which is greater than the first length d1f, and the fourth length d4f, which is greater than the second length d2f. This can effectively prevent the printed pad layer 2f from being unable to contact the printed baseline layer if due to errors, and relatively improve the process yield of the illuminating circuit structure 100f.

Figure 14:
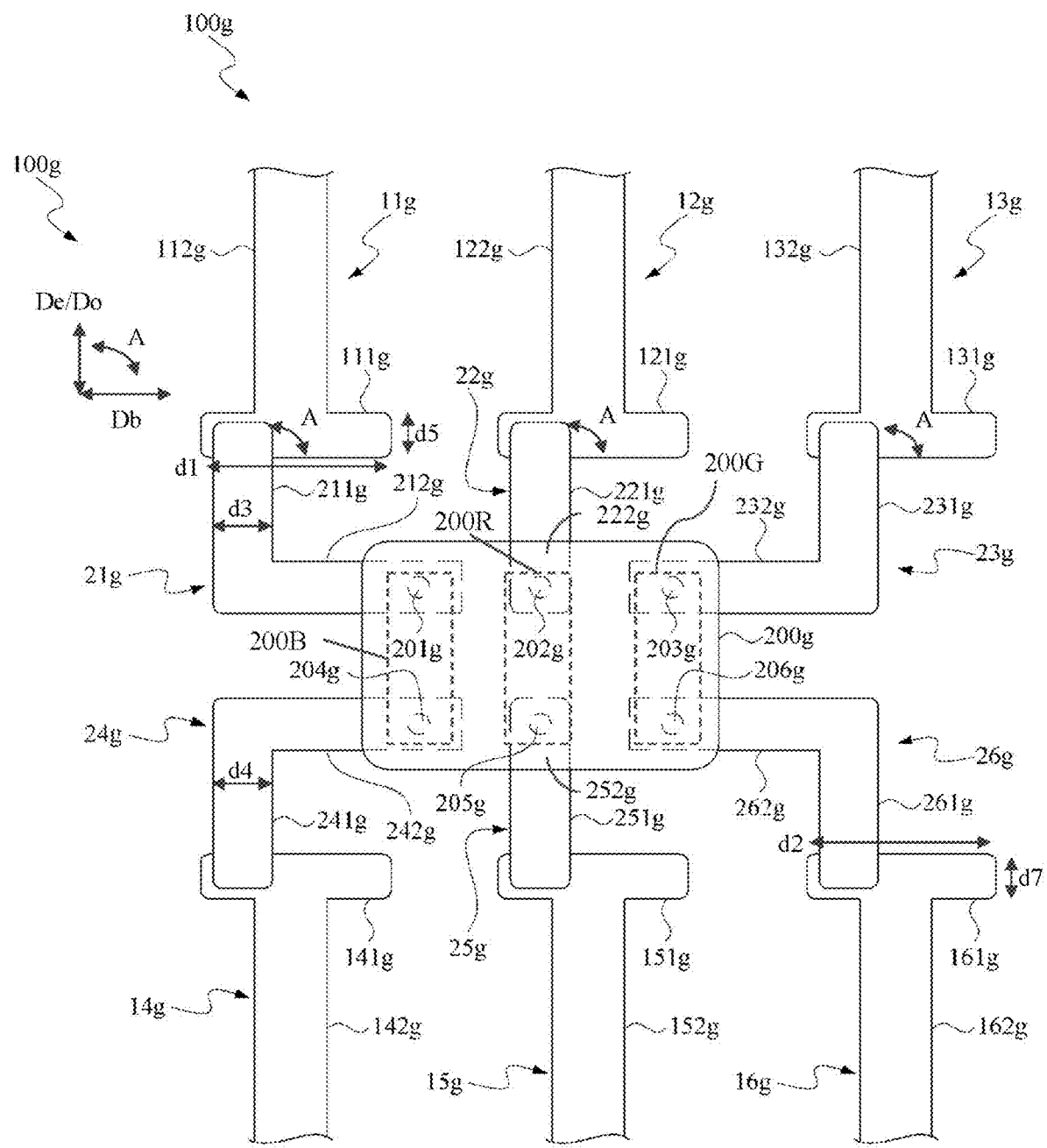
FIG. 14 is a schematic diagram illustrating a layout of an illuminating circuit structure of an eighth preferred embodiment according to the invention.

Please refer to FIG. 14, which is a schematic diagram illustrating a layout of an illuminating circuit structure of an eighth preferred embodiment according to the invention. An illuminating circuit structure 100g includes a printed baseline layer 1g and a printed pad layer 2g which are printed on a film sheet (not shown), for electrically connecting with a pair of electrodes of each of three illuminants 200R, 200G and 200B (e.g. including three light-emitting diodes; red, green, and blue, three in total). In FIG. 14, the three illuminants 200R, 200G and 200B are arranged in a straight line and have the same electrode connection direction De that is parallel to the baseline direction Do. In this embodiment, both the electrode connection direction De and the baseline direction Do form a tolerance included angle A with the bridging direction Db.

The printed baseline layer 1g includes three first baseline segments 11g, 12g and 13g and three second baseline segments 14g, 15g and 16g. The first baseline segments 11g, 12g and 13g respectively include a first baseline head 111g, 121g and 131g and a first baseline lead 112g, 122g and 132g. The three first baseline heads 111g, 121g and 131g extend in the bridging direction Db. The three first baseline leads 112g, 122g and 132g in the baseline direction Do/the electrode connection direction De that is nearly perpendicular to the bridging direction Db, and are integrally connected to the middles of the first baseline heads 111g, 121g and 131g. Each of the first baseline heads 111g, 121g and 131g has a first length d1 in the bridging direction Db and a fifth length d5 in the baseline direction Do/the electrode connection direction De, which is less than the fifth length d5.

The second baseline segments 14g, 15g and 16g respectively include a second baseline head 141g, 151g and 161g and a second baseline lead 142g, 152g and 162g. The second baseline heads 141g, 151g and 161g extend in the bridging direction Db. The second baseline leads 142g, 152g and 162g extends in the baseline direction Do/the electrode connection direction De. Each of the second baseline leads 142g, 152g and 162g has a second length d2 in the bridging direction Db and a seventh length d7 in the baseline direction Do/the electrode connection direction De, which is less than the second length d2.

The printed pad layer 2g includes three first pads 21g, 22g and 23g and three second pads 24g, 25g and 26g. The first pads 21g, 22g and 23g respectively include a rear end 211g, 221g and 231g and a front end 212g, 222g and 232g. The rear ends 211g and 231g extend in the baseline direction Do/the electrode connection direction De, and overlap ends of the first baseline heads 111g and 131g, respectively. The rear ends 211g and 231g respectively have a third length d3 in the bridging direction Db, which is less than the first length d1. The front ends 212g and 232g extend in the bridging direction Db, and are integrally connected to ends of the rear ends 211g and 231g, respectively. The front ends 212g, 222g and 232g are connected to the first electrodes 201g, 202g and 203g of the illuminant 200B, 200R and 200G, respectively.

The front end 232g and the front end 252g extend in the baseline direction Do/the electrode connection direction De, and are integrally connected to ends of the rear end 231g of the first pad 23g and the rear end 251g of the second pad 25g. In contrast, the first pads 21g and 23g are similar structures with mirror symmetry, and the difference is only that the front ends 212g and 232g of the first pads 21g and 23g are connected to opposite sides of the rear ends 211g and 231g of the first pads 21g and 23g, respectively. The same is true for the second pads 24g and 26g.

The second pads 24g, 25g and 26g respectively include a rear end 241g, 251g and 261g and a front end 242g, 252g and 262g. The front ends 242g and 262g extends in the bridging direction Db and are connected to second electrodes 204g, 205g and 206g of the illuminants 200B, 200R and 200G. The rear ends 241g, 251g and 261g extend in the baseline direction Do/the electrode connection direction De, and are connected to the second baseline heads 141g, 151g and 161g. The rear ends 241g, 251g and 261g respectively has a fourth length d4 in the bridging direction Db, which is less than the second length d2.

Continuing from the above, in the embodiment, the first baseline segments 11g, 12g and 13g and the second baseline segments 14g, 15g and 16g have the first baseline heads 111g, 121g and 131g and the second baseline heads 141g, 151g and 161g as branch structures, respectively. Even if print shifting of the first pads 21g, 22g and 23g and the second pads 24g, 25g and 26g occurs in the bridging direction De, the first baseline heads 111g, 121g and 131g and the second baseline heads 141g, 151g and 161g can still overlap the front ends 212g, 222g and 232g and the rear ends 241g, 251g and 261g. The rear ends 241g and 261g can also be regarded as the branch structures of the second pads 24g and 26g. To sum up, branch structures are formed where the baseline heads of the printed baseline layer 1g and the rear ends of the pads of the printed pad layer 2g are connected. These branch structures have the tolerance included angle A, which is conducive to reduction of the circuit density in the orthographic projection of the illuminant or around the illuminant in addition to making connections in the presence of print shifting. Besides, the first/second pad of the invention does not have branch structures such as T-shaped or L-shaped bends within the orthographic projection of the illuminant or around the illuminant and does not expand the occupied area, which avoids designs of limiting the disposition of the illuminant and also avoids the problems of overflowing, print shifting, and circuit shorting that may occur, which improves the printing process yield of micro illuminants such as mini-LEDs or micro-LEDs.

Furthermore, the first lengths d1 of the first baseline heads 111g, 121g and 131g in the bridging direction Db are greater than the fifth lengths d5 of the first baseline heads 111g, 121g and 131g in the baseline direction Do/the electrode connection direction De, respectively; the first lengths d1 greater than the third lengths d3 of the rear ends 211g, 221g and 231g in the bridging direction Db, respectively. Besides, the second lengths d2 of the second lengths d2 of the second baseline heads 141g, 151g and 161g in the bridging direction Db are greater than the seventh lengths d7 of the second baseline heads 141g, 151g and 161g in the baseline direction Do/the electrode connection direction De, respectively; the second lengths d2 are greater than the fourth lengths d4 of the rear ends 241g, 251g and 261g in the bridging direction Db, respectively. Therefore, it can ensure that the branch structures of the printed baseline layer 1g and the printed pad layer 2g are away from the illuminants 200B, 200R and 200G, so as to effectively solve the print shifting problem of the printed pad layer 2g, without increasing the circuit density in the orthographic projections of the illuminants 200B, 200R and 200G and around the illuminants 200B, 200R and 200G, and to relatively improve the process yield of the illuminating circuit structure 100.

Figure 15:
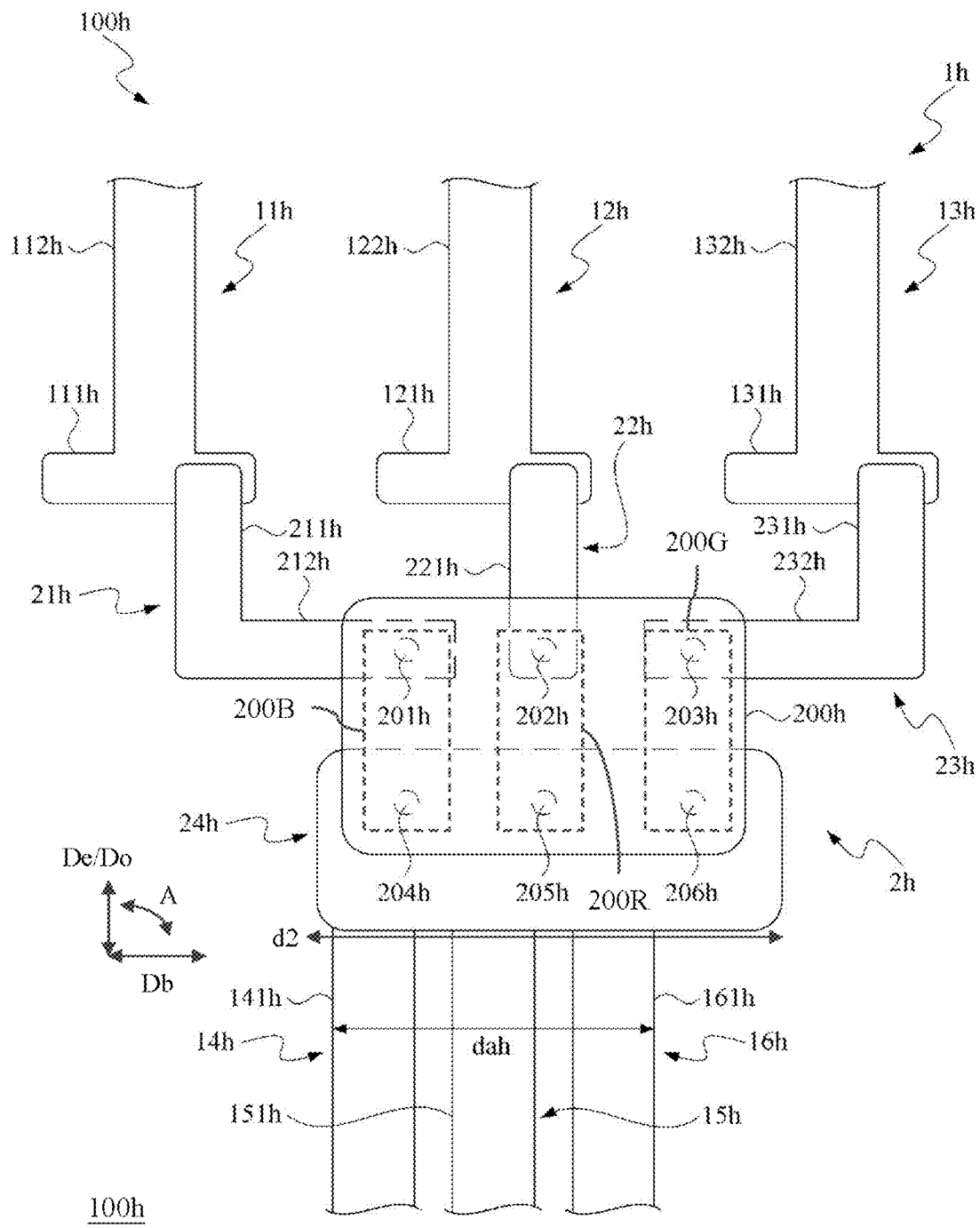
FIG. 15 is a schematic diagram illustrating a layout of an illuminating circuit structure of a ninth preferred embodiment according to the invention.

Please refer to FIG. 15, which is a schematic diagram illustrating a layout of an illuminating circuit structure of a ninth preferred embodiment according to the invention. An illuminating circuit structure 100h includes a printed baseline layer 1h and a printed pad layer 2h. In this embodiment, the electrode connection direction De is parallel to the baseline direction Do. Both the electrode connection direction De and the baseline direction Do form a tolerance included angle A with the bridging direction Db.

The printed baseline layer 1h includes three first baseline segments 11h, 12h and 13h and three second baseline segments 14h, 15h and 16h. The first baseline segments 11h, 12h and 13h respectively include a first baseline head 111h, 121h and 131h and a first baseline lead 112h, 122h and 132h. The first baseline segments 11h, 12h and 13h is structurally similar to the first baseline segments 11g, 12g and 13g of the above embodiment, and will not be described herein.

The second baseline segments 14h, 15h and 16h include the second baseline heads 141h, 151h and 161h extending in the bridging direction Db, respectively. The second baseline heads 141h, 151h and 161h include a span of layout area dah in the bridging direction Db; in more detail, the span of layout area dah refers to the total width of the outermost two of the second baseline headers 141h, 151h and 161h, that is, from the edge of the second baseline head 141h away from the second baseline head 151h to the edge of the second baseline head 161h away from the second baseline head 151h. In other words, the total width is equivalent to the sum of the widths of the second baseline heads 141h, 151h and 161h in the bridging direction Db and the gaps between the three.

The printed pad layer 2h includes three first pads 21h, 22h and 23h and a second pad 24h, connected to the first electrodes 201h, 202h and 203h and second electrodes 204h, 205h and 206h of the illuminants 200B, 200R and 200G, respectively.

The first pads 21h, 22h and 23h respectively include a rear end 211h, 221h and 231h and a front end 212h, 222h and 232h. The first pads 21h, 22h and 23h are structurally similar to the first pads 21g, 22g and 23g, and will not be described herein.

The second pad 24h extends in the bridging direction Db and has a second length d2 greater than the span of layout area dah, so that the second pad 24h can cross the second baseline heads 141h, 151h and 161h and be connected to the second baseline heads 141h, 151h and 161h.

In this embodiment, the front end 212h of the first pad 21h, the front end 222h of the first pad 22h, and the front end 232h of the first pad 23h are used to be connected to the three first electrodes 201h, 202h and 203h of an illuminant 200h. The three second electrodes 204h, 205h and 206h of the illuminants 200B, 200R and 200G are connected together to the second pad 24h. Therefore, the second pad 24h can achieve the effect of sharing the same cathode or anode for the illuminants 200B, 200R and 200G, which is the main difference between FIG. 14 and FIG. 15. Furthermore, the second pad 24h can be regarded as three independent pads that are connected in the bridging direction Db.

Figure 16:
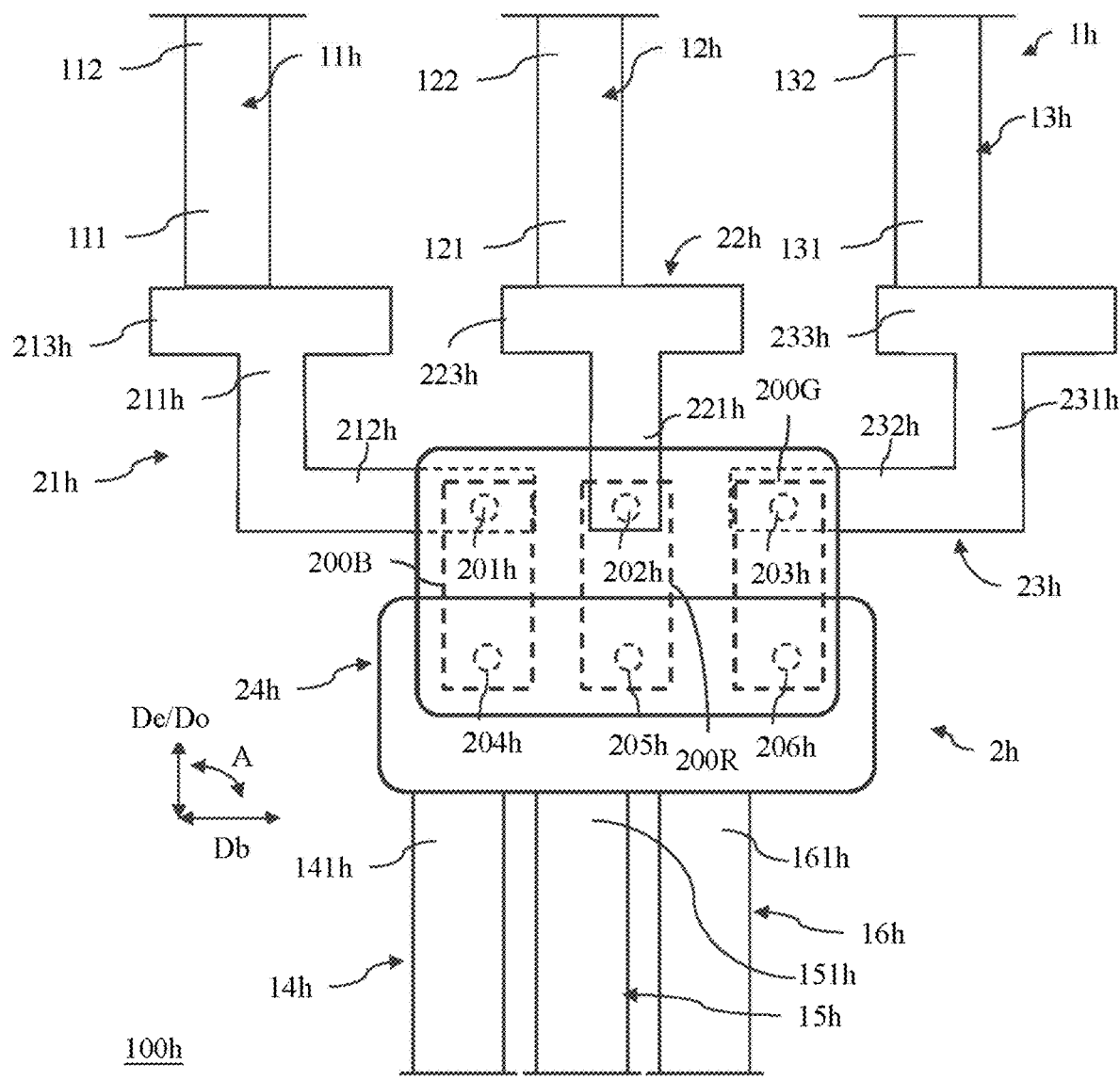
FIG. 16 is a schematic diagram illustrating a layout of an illuminating circuit structure of a tenth preferred embodiment according to the invention.

Please refer to FIG. 16, which is a schematic diagram illustrating a layout of an illuminating circuit structure of a tenth preferred embodiment according to the invention. The embodiments of FIG. 15 and FIG. 16 are similar and both have branch structures that are formed where the first baseline heads 111h, 121h and 131h with the rear ends 211h, 221h and 231h are connected. However, in FIG. 16, the first baseline heads 111h, 121h and 131h do not extend in the bridging direction Db. On the contrary, the rear ends 211h, 221h and 231h extending in the electrode connection direction De/the baseline direction Do further have rear ends 213h, 223h and 233h extending in the bridging direction Db, and overlap the first baseline heads 111h, 121h and 131h to form three branch structures with a tolerance included angle A. In this way, the above technical problems can also be solved and the same technical effect can be achieved.

As discussed above, the invention utilizes a printed baseline layer and a printed pad layer to form a branch structure where the printed baseline layer and the printed pad layer overlap, so that even if print shifting occurs on the printed pad layer in the manufacturing of the illuminating circuit structure, the rear end of the first/second pad of the printed pad layer still can overlap the first/second baseline head of the printed baseline layer. Furthermore, the branch structure is not located in the orthographic projection of the illuminant or around the orthographic projection, and the circuit density in the orthographic projection of the illuminant and around the illuminant is reduced, thereby improving the process yield of the illuminating circuit structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An illuminating circuit structure, comprising:
a first baseline segment, extending in a baseline direction, the first baseline segment comprising a first baseline head extending in an electrode connection direction, the first baseline head having a first length in the electrode connection direction and a fifth length in the baseline direction, the first length being substantially greater than the fifth length, the baseline direction and the electrode connection direction forming a tolerance included angle, the first baseline head of the first baseline segment forming a branch structure;
a second baseline segment, comprising a second baseline head extending in the electrode connection direction;
a first pad, comprising a first rear end and a first front end connecting with each other, the first rear end extending in the baseline direction and being connected to the first baseline head;
a second pad, comprising a second rear end and a second front end connecting with each other, the second rear end extending in the baseline direction and being connected to the second baseline head;
a film sheet, the first baseline segment, the second baseline segment, the first pad, and the second pad being disposed on the film sheet; and
an illuminant, having a pair of electrodes, the pair of electrodes defining the electrode connection direction, the pair of electrodes being electrically connected to the first front end and the second front end respectively, the first front end and the second front end except for the branch structure being located in an orthographic projection of the illuminant or around the orthographic projection.

2. The illuminating circuit structure according to claim 1, wherein the first baseline segment comprises a first baseline lead extending in the baseline direction, and the first baseline head is integrally connected to the first baseline lead to form the branch structure.

3. The illuminating circuit structure according to claim 1, wherein the first pad as a whole has a sixth length in the baseline direction, and the sixth length is greater than the fifth length of the first baseline head.

4. The illuminating circuit structure according to claim 1, wherein the second baseline segment has a second baseline lead extending in the baseline direction to form another branch structure.

5. The illuminating circuit structure according to claim 1, wherein the second baseline head has a second length in the electrode connection direction and a seventh length in the baseline direction, and the second length is substantially greater than the seventh length.

6. An illuminating circuit structure, comprising:
a first baseline segment, comprising a first baseline head extending in a baseline direction, the first baseline head having first length in an electrode connection direction;
a second baseline segment, comprising a second baseline head extending in the baseline direction;
a first pad, comprising a first rear end and a first front end connecting with each other, the first rear end extending in the electrode connection direction and having a third length in the electrode connection direction greater than the first length, the first rear end being connected to the first baseline head, the baseline direction and the electrode connection direction forming a tolerance included angle, the first rear end of the first pad forming a branch structure;
a second pad, comprising a second rear end and a second front end connecting with each other, the second rear end extending in the electrode connection direction and being connected to the second baseline head;
a film sheet, the first baseline segment, the second baseline segment, the first pad, and the second pad being disposed on the film sheet; and
an illuminant, having a pair of electrodes, the pair of electrodes defining the electrode connection direction, the pair of electrodes being electrically connected to the first front end and the second front end respectively, the first front end and the second front end except for the branch structure being located in an orthographic projection of the illuminant or around the orthographic projection.

7. The illuminating circuit structure according to claim 6, wherein the first pad comprises a first front end extending in the baseline direction, and the first rear end is integrally connected to the first front end to form the branch structure.

8. The illuminating circuit structure according to claim 6, wherein the first pad and the second pad have a same shape but are arranged asymmetrically to each other.

9. The illuminating circuit structure according to claim 6, wherein the first front end is integrally connected to a middle or end portion of the first rear end.

10. The illuminating circuit structure according to claim 6, wherein the first baseline head and the first rear end form a cross shape.

11. The illuminating circuit structure according to claim 6, wherein the illuminant, the first front end, and the second front end are between the first baseline segment and the second baseline segment.

12. The illuminating circuit structure according to claim 6, wherein a sum of lengths of the illuminant, the first pad, and the second pad in the electrode connection direction is greater than a distance between the first baseline segment and the second baseline segment.

13. The illuminating circuit structure according to claim 6, wherein the first front end and the second front end are respectively vertical to the electrode connection direction.

14. The illuminating circuit structure according to claim 6, wherein the first baseline segment comprises a first baseline lead extending in the baseline direction, the second baseline segment comprises a second baseline lead extending in the baseline direction, and the first baseline lead and the second baseline lead are spaced in the baseline direction and/or the electrode connection direction.

15. An illuminating circuit structure, comprising:
at least one first baseline segment extending in an electrode connection direction, the first baseline segment comprising a first baseline head;
at least one second baseline segment extending in the electrode connection direction, the first baseline segment comprising a second baseline head;
at least one first pad comprising a first rear end and a first front end connecting with each other, the first rear end extending in a bridging direction and being connected to the first baseline head, the bridging direction and the electrode connection direction forming a tolerance included angle, a branch structure being formed where the first baseline head and the first rear end are connected;
at least one second pad extending in the bridging direction and being connected to the second baseline head;
a film sheet, the first baseline segment, the second baseline segment, the first pad, and the second pad being disposed on the film sheet; and
at least one illuminant having a pair of electrodes, the pair of electrodes defining the electrode connection direction, the pair of electrodes being electrically connected to the first pad and the second pad respectively;
wherein the branch structure is not located in an orthographic projection of the illuminant or around the orthographic projection, and the branch structure has the tolerance included angle.

16. The illuminating circuit structure according to claim 15, wherein the first baseline head of the first baseline segment extends in the bridging direction, and the first rear end extends in the electrode connection direction, forming the branch structure.

17. The illuminating circuit structure according to claim 15, wherein the first baseline head has a first length in the electrode connection direction and a fifth length in the baseline direction, and the first length is substantially greater than the fifth length.

18. The illuminating circuit structure according to claim 15, wherein two of the at least one first baseline head extend in the bridging direction, two of the at least one first rear end extend in the electrode connection direction, and the two first baseline heads and the two first rear ends respectively form a branch structure.

19. The illuminating circuit structure according to claim 15, wherein a sum of lengths of the first pad and the second pad in the bridging direction is greater than a distance between the first baseline segment and the second baseline segment.

20. The illuminating circuit structure according to claim 15, wherein the illuminant is located in a keycap projection or a gap surrounding the keycap projection on the film sheet.

* * * * *